US012777932B2

(12) United States Patent
Ohira et al.

(10) Patent No.: US 12,777,932 B2
(45) Date of Patent: Oct. 27, 2026

(54) COOLING MECHANISM HAVING NANOCAPILLARY STRUCTURE, SEMICONDUCTOR DEVICE PROVIDED WITH COOLING MECHANISM, METHOD FOR MANUFACTURING SAME, AND ELECTRONIC DEVICE

(71) Applicants: SONY GROUP CORPORATION, Tokyo (JP); SONY SEMICONDUCTOR SOLUTIONS CORPORATION, Kanagawa (JP)

(72) Inventors: Hikaru Ohira, Kanagawa (JP); Yoichiro Fujinaga, Kanagawa (JP); Christopher Wright, London (GB); Jan Jasper Van Den Berg, London (GB); Matthew Lawrenson, London (GB)

(73) Assignees: Sony Group Corporation, Tokyo (JP); Sony Semiconductor Solutions Corporation, Kanagawa (JP)

( * ) Notice: Subject to any disclaimer, the term of this patent is extended or adjusted under 35 U.S.C. 154(b) by 511 days.

(21) Appl. No.: 18/256,496

(22) PCT Filed: Dec. 2, 2021

(86) PCT No.: PCT/JP2021/044272

§ 371 (c)(1),
(2) Date: Jun. 8, 2023

(87) PCT Pub. No.: WO2022/131004

PCT Pub. Date: Jun. 23, 2022

(65) Prior Publication Data

US 2024/0030102 A1 Jan. 25, 2024

(30) Foreign Application Priority Data

Dec. 16, 2020 (JP) ................................ 2020-208032

(51) Int. Cl.
*H01L 23/473* (2006.01)
*H01L 21/02* (2006.01)
(Continued)

(52) U.S. Cl.
CPC ............ *H10W 40/47* (2026.01); *H10P 14/68* (2026.01); *H10P 54/00* (2026.01); *H10W 40/60* (2026.01); *H10W 99/00* (2026.01)

(58) Field of Classification Search
CPC ............ H01L 23/473; H01L 21/02115; H01L 21/02112; H01L 21/481; H01L 2924/14;
(Continued)

(56) References Cited

U.S. PATENT DOCUMENTS 9,484,543 B2 * 11/2016 Sansom ................ B82Y 10/00
2006/0098411 A1 * 5/2006 Lee .................... F28D 15/0233
257/E23.088
(Continued)

FOREIGN PATENT DOCUMENTS

DE 102018218832 A1 5/2020
EP 3098847 11/2016
(Continued)

OTHER PUBLICATIONS

International Search Report and Written Opinion prepared by the Japan Patent Office on Feb. 2, 2022, for International Application No. PCT/JP2021/044272, 2 pgs.

*Primary Examiner* — Adam B Dravininkas
(74) *Attorney, Agent, or Firm* — SHERIDAN ROSS P.C.

(57) ABSTRACT

Conventional problems are solved by providing a cooling mechanism having a nanocapillary structure constituted by graphene, a semiconductor device including the cooling mechanism, a method for manufacturing the same, and an electronic device.

A first metal layer, a first graphene layer formed on the first metal layer and having a nanocapillary channel, a second
(Continued)

graphene layer joined to an upper surface of the nanocapillary channel to form an opening of a passage for a refrigerant, and a second metal layer covering the second graphene layer are included.

14 Claims, 21 Drawing Sheets

(51) Int. Cl.

| | |
|---|---|
| ***H01L 21/48*** | (2006.01) |
| ***H01L 21/78*** | (2006.01) |
| ***H01L 23/40*** | (2006.01) |
| ***H10P 14/68*** | (2026.01) |
| ***H10P 54/00*** | (2026.01) |
| ***H10W 40/47*** | (2026.01) |
| ***H10W 40/60*** | (2026.01) |
| ***H10W 99/00*** | (2026.01) |

(58) Field of Classification Search
CPC ........... H01L 2924/01006; H01L 23/40; H01L 21/78; H01L 21/4882; H01L 21/4871; H01L 23/3735; H01L 23/373; H01L 2225/06589; F28D 15/046; F28D 15/0233; F28D 15/04; F28D 15/0275; H05K 1/0272; H05K 1/09; H05K 7/20336
See application file for complete search history.

(56) References Cited

U.S. PATENT DOCUMENTS

| | | | | |
|---|---|---|---|---|
| 2007/0053168 | A1* | 3/2007 | Sayir | C04B 35/645 257/E23.105 |
| 2007/0126137 | A1* | 6/2007 | Zhamu | H01M 8/0245 264/105 |
| 2007/0158050 | A1 | 7/2007 | Norley et al. | |
| 2007/0272399 | A1* | 11/2007 | Nitta | F28D 15/0233 165/185 |
| 2008/0268318 | A1* | 10/2008 | Jang | H01M 8/241 429/492 |
| 2010/0021736 | A1* | 1/2010 | Slinker | C01B 32/16 428/408 |
| 2011/0032678 | A1* | 2/2011 | Altman | H01L 23/373 977/762 |
| 2012/0090816 | A1 | 4/2012 | Bayazitoglu | |
| 2012/0094484 | A1 | 4/2012 | Altman et al. | |
| 2015/0194363 | A1* | 7/2015 | Jun | H01L 21/3081 257/714 |
| 2017/0368795 | A1 | 12/2017 | Kutsumizu et al. | |
| 2018/0061736 | A1* | 3/2018 | Hirose | H01L 23/373 |
| 2018/0155825 | A1* | 6/2018 | Farquhar | B32B 5/18 |
| 2019/0318980 | A1 | 10/2019 | Hirose et al. | |
| 2019/0348345 | A1* | 11/2019 | Parida | F28D 15/0233 |
| 2020/0132391 | A1* | 4/2020 | Paavola | F28D 15/046 |
| 2021/0123641 | A1* | 4/2021 | Monazami | F25B 21/02 |
| 2021/0218110 | A1* | 7/2021 | Lanning | H01M 50/414 |

FOREIGN PATENT DOCUMENTS

| | | |
|---|---|---|
| JP | 2009-522808 | 6/2009 |
| JP | 2013-501379 | 1/2013 |
| JP | 2017-033779 | 2/2017 |
| JP | 2017-108046 | 6/2017 |
| JP | 2018-032764 | 3/2018 |
| JP | 2020077875 A | 5/2020 |
| WO | WO 2016/104759 | 6/2016 |

* cited by examiner

COOLING MECHANISM HAVING NANOCAPILLARY STRUCTURE, SEMICONDUCTOR DEVICE PROVIDED WITH COOLING MECHANISM, METHOD FOR MANUFACTURING SAME, AND ELECTRONIC DEVICE

CROSS REFERENCE TO RELATED APPLICATIONS

This application is a national stage application under 35 U.S.C. 371 and claims the benefit of PCT Application No. PCT/JP2021/044272, having an international filing date of 2 Dec. 2021, which designated the United States, which PCT application claimed the benefit of Japanese Patent Application No. 2020-208032, filed 16 Dec. 2020, the entire disclosures of each of which are incorporated herein by reference.

TECHNICAL FIELD

The present disclosure relates to a cooling mechanism having a nanocapillary structure constituted by graphene or the like, a semiconductor device including the cooling mechanism, a method for manufacturing the same, and an electronic device.

BACKGROUND ART

Conventionally, with the progress of miniaturization of semiconductor processes and an increase in speed of semiconductor chips, power consumption of semiconductor chips has increased, resulting in an increase in the amount of heat generated. The increase in the amount of heat generated in semiconductor chips causes problems such as characteristic fluctuation and reliability deterioration. For this reason, semiconductor packages have been required to efficiently cool chips.

As a cooling mechanism of a semiconductor package that meets such needs, a technique of mounting a heat dissipation fin and a heat pipe is known.

According to the configuration disclosed in Patent Document 1, a technique of mixing graphene particles in a sealing resin covering a semiconductor chip is disclosed.

The semiconductor chip is molded with a resin to prevent entry of moisture and the like and to prevent deterioration of characteristics of the semiconductor chip, but the semiconductor chip has low heat dissipation to heat generated by an operating current and the like, and is likely to have a high temperature. Graphene is suitable for use as a heat transfer filler because of its good thermal conductivity and light mass. Therefore, by mixing the graphene particles in the sealing resin, the thermal conductivity of the sealing resin is improved, and the heat dissipation of the semiconductor device can be improved.

According to the configuration disclosed in Patent Document 2, a technique for efficiently cooling a semiconductor light-emitting element and suppressing adhesion of dust to the vicinity of a lead terminal connection portion on the substrate is disclosed.

Specifically, a light source unit including a plurality of semiconductor light-emitting elements arranged in a matrix includes a heat dissipation member that sandwiches an element connection substrate together with an element holding member, and a plurality of heat pipes provided in contact with the element holding member, in order to cool heat generated by the semiconductor light-emitting elements.

Here, the heat generated in the semiconductor light-emitting elements is dissipated through either of a first or second heat conduction path. That is, in the first heat conduction path, heat is sequentially conducted through the element holding member, the element connection substrate, and the heat dissipation member, and is dissipated by the heat dissipation fin.

On the other hand, in the second heat conduction path, heat is conducted from the element holding member to the heat pipe, is transmitted to the heat dissipation fin via the liquid in the heat pipe, and is dissipated at the heat dissipation fin. The semiconductor light-emitting element can be efficiently cooled by heat dissipation using the first and second heat conduction paths.

CITATION LIST

Patent Document

Patent Document 1: Japanese Patent Application National Publication (Laid-Open) No. 2017-108046

Patent Document 2: Japanese Patent Application Laid-Open No. 2017-33779

SUMMARY OF THE INVENTION

Problems to be Solved by the Invention

However, although the technique disclosed in Patent Document 1 can improve the heat dissipation of the semiconductor device by its excellent thermal conductivity by mixing graphene particles in the sealing resin covering the semiconductor chip, graphene particles having excellent thermal conductivity are also excellent in electrical conductivity at the same time, and therefore when the mixing amount is increased, the problem arises that the insulation properties cannot be maintained. Therefore, in a high-integration semiconductor device that operates at a high frequency with a large amount of heat generation, its effect is limited, and it must be said that its heat dissipation performance is inferior to heat dissipation fins, heat pipes, and the like, and it cannot become the mainstream of heat dissipation devices of semiconductor devices.

In addition, the technique disclosed in Patent Document 2 has a first heat conduction path through which heat is sequentially conducted through the element holding member, the element connection substrate, and the heat dissipation member and is dissipated at the heat dissipation fin, and a second heat conduction path through which heat is transferred from the element holding member to the heat dissipation fin through the heat pipe and is dissipated at the heat dissipation fin, and the semiconductor light-emitting element can be efficiently cooled by heat dissipation using these first and second heat conduction paths.

However, in order to realize high cooling capacity, it is necessary to increase the surface area of the heat dissipation fin because the heat resistance of the heat dissipation fin needs to be reduced. For this reason, it is necessary to increase the height of the fin or increase the number of fins, resulting in a larger size than the main body portion of the semiconductor device.

In addition, it is necessary to increase a pipe diameter of the heat pipe in order to improve circulation of the cooling fluid moving in the heat pipe. Both of the cooling mechanisms need to be increased in size in order to realize high cooling capacity, and there is a problem that it is against miniaturization or height reduction of the semiconductor package.

The present disclosure has been made in view of the above-described problems, and an object of the present disclosure is to provide a cooling mechanism having a nanocapillary structure, a semiconductor device including the cooling mechanism, a method for manufacturing the same, and an electronic device, in which the conventional problems are solved by using a nanocapillary channel structure constituted by graphene for a cooling mechanism of a semiconductor chip.

Solutions to Problems

The present disclosure has been made to solve the above-described problems, and a first aspect thereof is a cooling mechanism including: a first metal layer; a first graphene layer formed on the first metal layer and having a nanocapillary channel; a second graphene layer joined to an upper surface of the nanocapillary channel to form an opening of a passage for a refrigerant; and a second metal layer covering the second graphene layer.

In addition, a second aspect is a cooling mechanism including: a first metal layer; a first graphene layer formed on the first metal layer and having a nanocapillary channel; a second graphene layer bonded to an upper surface of the nanocapillary channel; and a second metal layer covering the second graphene layer having an opening penetrating both ends of the second graphene layer in a vertical direction and communicating with the nanocapillary channel.

In addition, in the first or second aspect, a plurality of the first graphene layer and the second graphene layer having the nanocapillary channel may be laminated between the first metal layer and the second metal layer.

In addition, in the first to third aspects, the second graphene layer and the second metal layer may have an air vent hole penetrating therethrough.

In addition, in the first to fourth aspects, the opening may have an inlet through which the refrigerant is sucked on one side and an outlet through which the refrigerant is discharged on another side, the inlet and the outlet protruding in a horizontal direction or erected upward.

In addition, a sixth aspect is a semiconductor device including a cooling mechanism including: a first metal layer; a first graphene layer formed on the first metal layer and having a nanocapillary channel; a second graphene layer joined to an upper surface of the nanocapillary channel to form an opening of a passage for a refrigerant; and a second metal layer covering the second graphene layer.

In addition, a seventh aspect is a semiconductor device including a cooling mechanism including: a first metal layer; a first graphene layer formed on the first metal layer and having a nanocapillary channel; a second graphene layer bonded to an upper surface of the nanocapillary channel; and a second metal layer covering the second graphene layer having an opening penetrating both ends of the second graphene layer in a vertical direction and communicating with the nanocapillary channel.

In addition, an eighth aspect is a semiconductor device including a cooling mechanism including: a first metal layer; a first graphene layer formed on the first metal layer and having a nanocapillary channel; a second graphene layer joined to an upper surface of the nanocapillary channel to form an opening of a passage for a refrigerant; and a second metal layer covering the second graphene layer, in which a plurality of the first graphene layer and the second graphene layer having the nanocapillary channel is laminated between the first metal layer and the second metal layer.

In addition, a ninth aspect is a semiconductor device including a cooling mechanism including: a first metal layer; a first graphene layer formed on the first metal layer and having a nanocapillary channel; a second graphene layer bonded to an upper surface of the nanocapillary channel; and a second metal layer covering the second graphene layer having an opening penetrating both ends of the second graphene layer in a vertical direction and communicating with the nanocapillary channel, in which a plurality of the first graphene layer and the second graphene layer having the nanocapillary channel is laminated between the first metal layer and the second metal layer.

In addition, in the sixth to ninth aspects, the opening of the cooling mechanism may have an inlet through which the refrigerant is sucked on one side and an outlet through which the refrigerant is discharged on another side, the inlet and the outlet protruding in a horizontal direction or erected upward.

In addition, an 11th aspect is a semiconductor device including: a cooling mechanism including: a first metal layer; a first graphene layer formed on the first metal layer and having a nanocapillary channel; a second graphene layer joined to an upper surface of the nanocapillary channel to form an opening of a passage for a refrigerant; and a second metal layer covering the second graphene layer; and a semiconductor chip surrounded by a partition wall and disposed in a hollow cavity formed by covering an upper surface of the cooling mechanism with a cover glass on the upper surface of the cooling mechanism.

In addition, in this 11th aspect, the partition wall may be configured to be air-permeable to an external space by the nanocapillary channel.

In addition, in the 11th or 12th aspect, the second graphene layer and the second metal layer covering the second graphene layer may have an air vent hole penetrating therethrough.

It is a method for manufacturing a cooling mechanism, the method including: forming a first graphene layer on a first copper plate; forming a nanocapillary channel in the first graphene layer; forming a second graphene layer on a second copper plate; and bonding a surface of the second graphene layer formed on the second copper plate to the nanocapillary channel formed in the first graphene layer.

In addition, a 15th aspect is a method for manufacturing a semiconductor device including a cooling mechanism, the method including: forming a first insulating layer on a first silicon or glass substrate; forming a first copper layer on the first insulating layer; forming a first graphene layer on the first copper layer to form a nanocapillary channel; forming an insulating layer on a second silicon or glass substrate; forming a second copper layer on the insulating layer; forming a second graphene layer on the second copper layer; bonding the nanocapillary channel formed on the first silicon or glass substrate and the second graphene layer formed on the second silicon or glass substrate; removing the first silicon or glass substrate; forming a first adhesive layer on a third glass substrate; rearranging a plurality of known good die (KGD) semiconductor chips on the first adhesive layer; filling the KGD semiconductor chips rearranged on the third glass substrate with a mold, flattening a surface of the semiconductor chips, and forming a second adhesive layer on the surface of the semiconductor chips; bonding a surface from which the first silicon or glass substrate has been removed to the second adhesive layer, and mounting the nanocapillary channel on the semiconductor chips filled with the mold; debonding and removing the third glass substrate;

removing the second silicon or glass substrate; and dicing the semiconductor chips filled with the mold and the nanocapillary channel mounted on the semiconductor chips.

In addition, a 16th aspect is an electronic device including a semiconductor device using a cooling mechanism including: a first metal layer; a first graphene layer formed on the first metal layer and having a nanocapillary channel; a second graphene layer joined to an upper surface of the nanocapillary channel to form an opening of a passage for a refrigerant; and a second metal layer covering the second graphene layer.

By adopting the above aspects, it is possible to provide a cooling mechanism having cooling capability without violating miniaturization or height reduction of a semiconductor package, a semiconductor device including the cooling mechanism, a method for manufacturing the same, and an electronic device.

MODE FOR CARRYING OUT THE INVENTION

Figure 1:
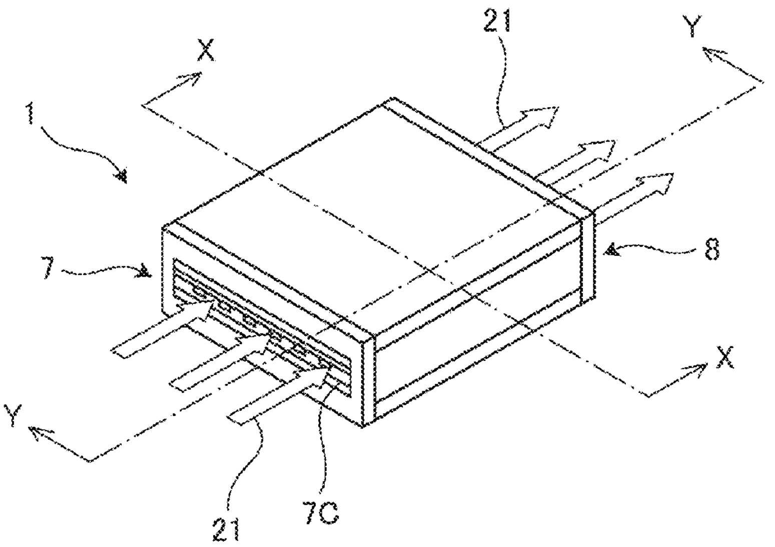
FIG. 1 is an external perspective view illustrating a configuration example of a cooling mechanism according to a first embodiment.

Next, modes for carrying out the technology according to the present disclosure (hereinafter, referred to as "embodiments") will be described in the following order with reference to the drawings. Note that, in the following drawings, the same or similar parts are denoted by the same or similar reference numerals. In addition, since the drawings are schematic, some descriptions are omitted, and dimensional ratios and the like of respective parts do not necessarily coincide with actual ones. In addition, it is needless to say that the drawings include parts having different dimensional relationships and ratios.

1. Configuration Example of Cooling Mechanism According to First Embodiment
2. Example of Method for Manufacturing Cooling Mechanism According to First Embodiment
3. Configuration Example of Cooling Mechanism According to Second Embodiment
4. Example of Method for Manufacturing Cooling Mechanism According to Second Embodiment
5. Configuration Example of Cooling Mechanism According to Third Embodiment
6. Example of Method for Manufacturing Cooling Mechanism According to Third Embodiment
7. Configuration Example of Cooling Mechanism According to Fourth Embodiment
8. Example of Method for Manufacturing Cooling Mechanism According to Fourth Embodiment
9. Example of Method for Manufacturing Semiconductor Device Equipped With Cooling Mechanism According to First Embodiment
10. Example of Method for Manufacturing Semiconductor Device Equipped With Cooling Mechanism According to Second Embodiment
11. Example of Method for Manufacturing Semiconductor Device Equipped With Cooling Mechanism According to Third Embodiment
12. Example of Method for Manufacturing Semiconductor Device Using Cooling Mechanism According to Fourth Embodiment
13. Another Embodiment of Semiconductor Device Using Cooling Mechanism According to Present Disclosure
14. Configuration Example of Electronic Device

1. Configuration Example of Cooling Mechanism According to First Embodiment

FIG. 1 is an external perspective view illustrating a configuration example of a cooling mechanism 1 according to a first embodiment. As illustrated in the drawing, the cooling mechanism 1 is formed in a substantially rectangular shape. Then, an inlet 7 for sucking a cooling medium is provided on one side (front surface), and an outlet 8 for discharging a cooling medium (hereinafter, referred to as a "refrigerant") is provided on the other side (back surface).

Figure 2:
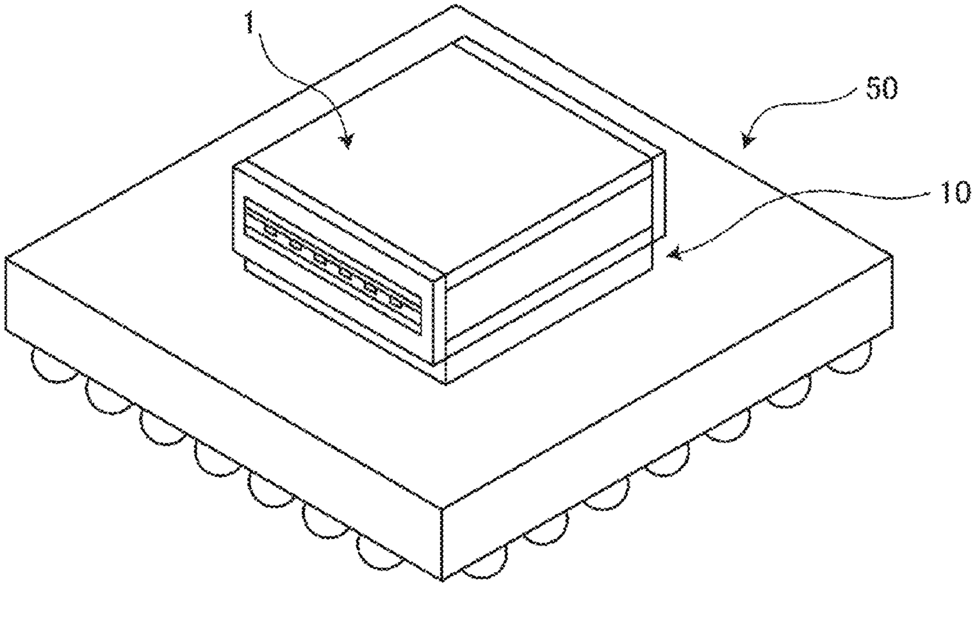
FIG. 2 is an external perspective view of a semiconductor device on which the cooling mechanism according to the first embodiment is mounted.

FIG. 2 is an external perspective view of a semiconductor device 10 on which the cooling mechanism 1 according to the first embodiment is mounted. The cooling mechanism 1 according to the present disclosure can be mounted on, for example, the semiconductor device 10 as illustrated in the drawing, and further mounted on a PKG substrate 50 to be used as a PKG structure having a nanocapillary channel cooling mechanism. In addition, on the contrary, the semiconductor device 10 can be mounted on the cooling mechanism 1 for use, or the cooling mechanism 1 can be used as a component of the semiconductor device 10.

Figure 3A:
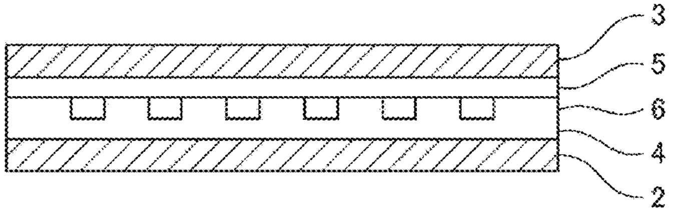
FIGS. 3A and 3B are schematic views of an X-X line cut portion end surface and a Y-Y cut portion end surface of the configuration example of FIG. 1.
Figure 3B:
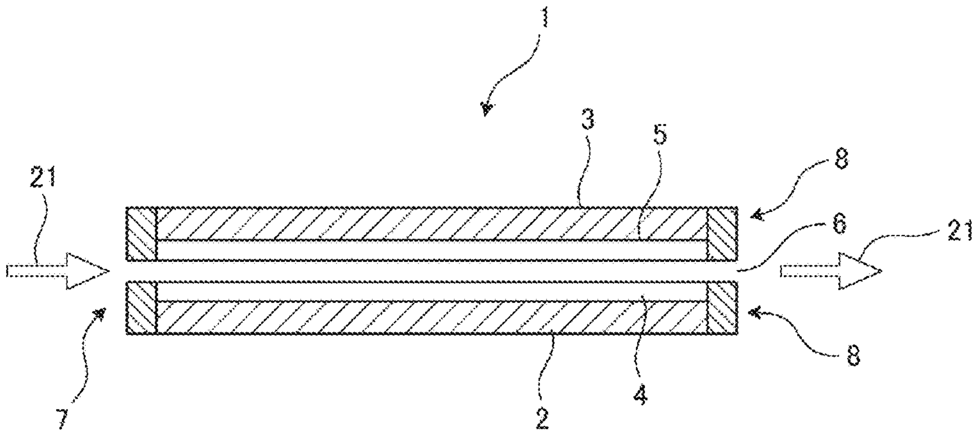

FIGS. 3A and 3B are schematic views of an X-X line cut portion end surface and a Y-Y line cut portion end surface of the configuration example of FIG. 1. In the internal configuration of the cooling mechanism 1 in the width direction, as illustrated in FIG. 3A, a plurality of nanocapillary channels 6 is formed between graphene layers 4 and 5 sandwiched between a copper plate 2 as a first metal layer and a copper plate 3 as a second metal layer disposed vertically. In addition, in the internal configuration from the front surface to the back surface direction (that is, the Y-Y line direction) of the cooling mechanism 1, as illustrated in FIG. 3B, the nanocapillary channel 6 communicates from the inlet 7 to the outlet 8 to form a vent hole through which the cooling medium passes.

Therefore, as illustrated in FIG. 1, when a refrigerant 21 indicated by an arrow is sucked from the inlet 7, the refrigerant 21 passes through the nanocapillary channel 6. Then, the heat of the heating element is transferred to the refrigerant 21 at the time of passage, and the heat is also released at the same time when being discharged from the outlet 8. The cooling principle of the cooling mechanism 1 according to the present disclosure is as described above. Note that details of the nanocapillary channel 6 will be described later. In addition, in the following description, unless otherwise specified, a drawing of an X-X line cut portion end surface is referred to as an "X cross-sectional view", and a drawing of a Y-Y line cut portion end surface is referred to as a "Y cross-sectional view".

Since the cooling mechanism 1 according to the present disclosure is configured as described above, for example, the cooling mechanism 1 can be used as a cooler of the semiconductor device 10 by being mounted on the semiconductor device 10 and connected to a cooling device 20 that performs cooling by circulating the refrigerant 21 or the like. The configuration of the cooling method is roughly classified into natural cooling and forced cooling, and liquid cooling type and air cooling type are considered as the forced cooling.

In the natural cooling, as illustrated in FIG. 1A, openings 7*c* and 8*c* are provided in the inlet 7 and the outlet 8, and the air passes through the nanocapillary channel 6 by natural convection or the like to dissipate heat. In the forced cooling, for example, a liquid refrigerant 21 such as water or a gas refrigerant 21 such as air is forcibly caused to pass through the nanocapillary channel 6, the heat of the heating element is transferred to the refrigerant 21 during the passage, and the heat is simultaneously released when the refrigerant is discharged from the outlet 8.

Figure 13L:
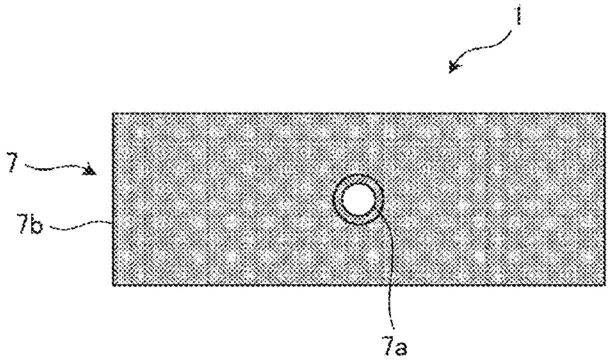
FIGS. 13L and 13M are a front external view and a plan view respectively (part 2) illustrating the method for manufacturing the cooling mechanism according to the first embodiment.
Figure 13M:
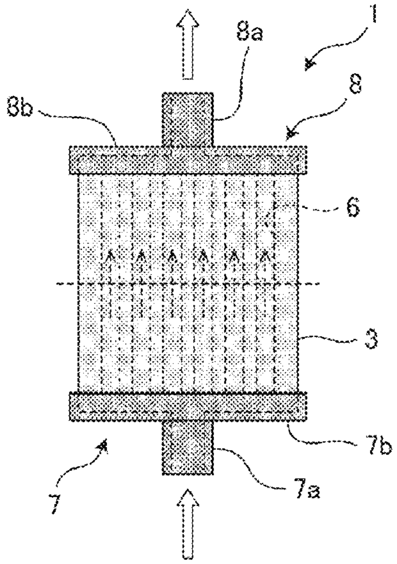
Figure 14A:
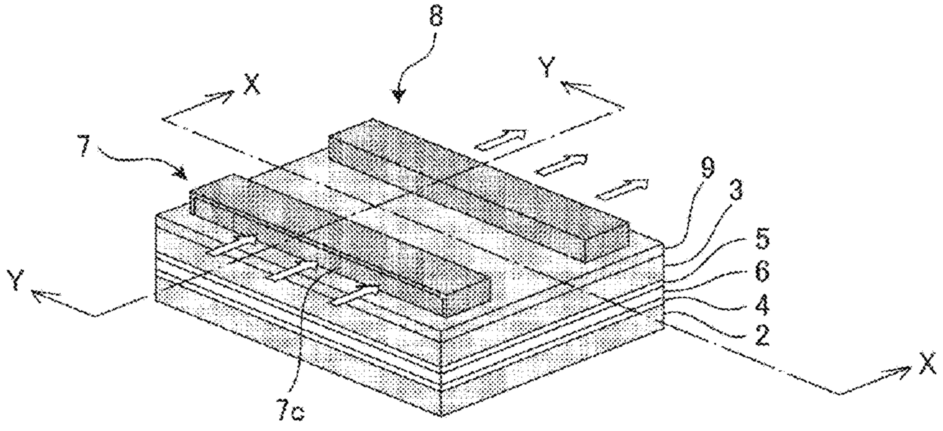
FIGS. 14A, 14B and 14C are external perspective views and a cross-sectional view respectively illustrating a configuration example of a cooling mechanism according to a second embodiment.
Figure 14B:
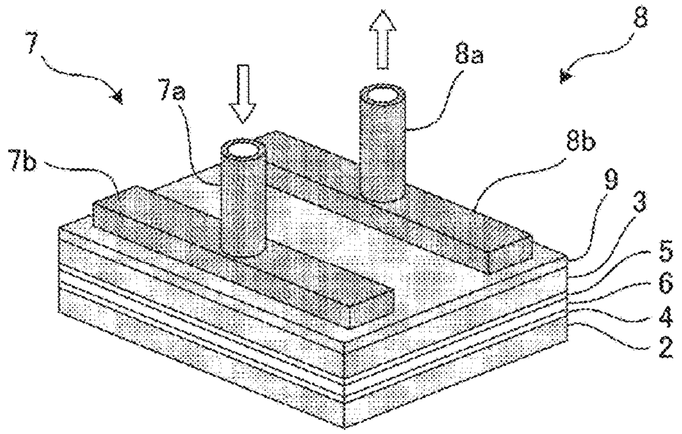

In the case of forced cooling, the cooling mechanism 1 in which substantially cylindrical joints 7*a* and 8*a* are provided to protrude from the inlet 7 and the outlet 8 is used (see FIGS. 13 and 14B for external shapes). Note that the joints 7*a* and 8*a* may protrude in the horizontal direction or may be erected upward depending on the injection direction of the refrigerant 21. In addition, both may be combined. In addition, an annular protrusion for preventing the pipe from coming off may be provided on the substantially cylindrical peripheral surface, or may be screwed for screwing with the pipe.

Figure 4:
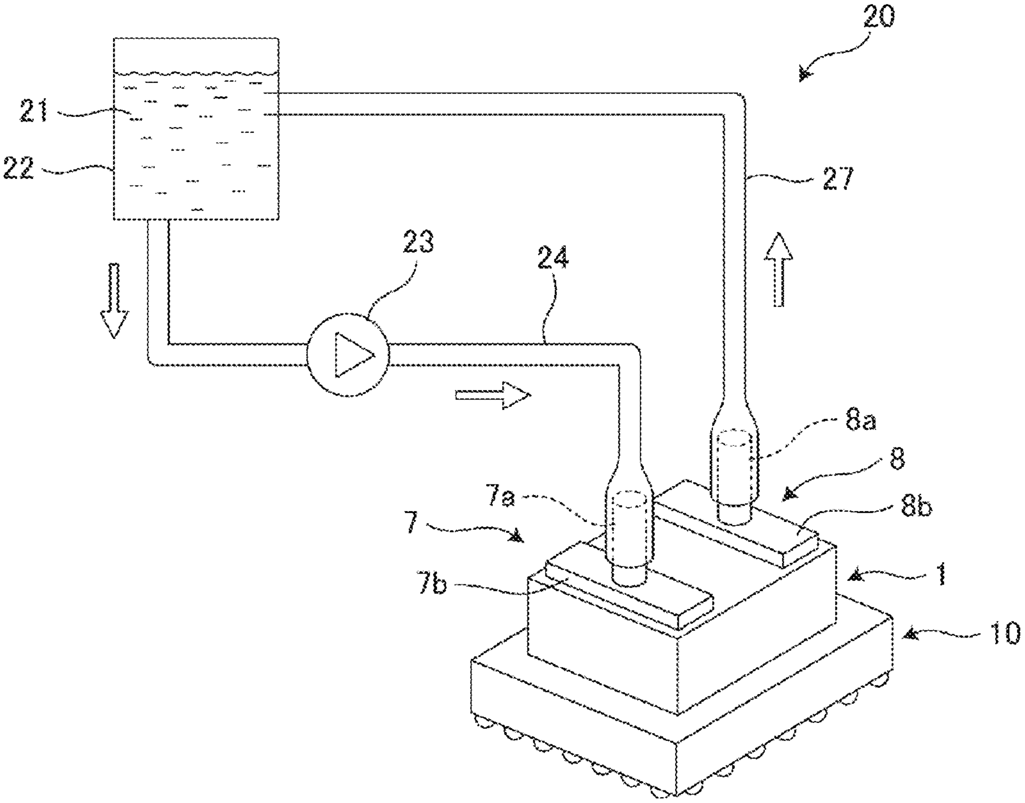
FIG. 4 is a view illustrating a configuration example of a liquid cooling type cooling method for a semiconductor device using a cooling mechanism according to the present disclosure.

For example, as illustrated in FIG. 4, the liquid cooling type of forced cooling is configured such that the refrigerant 21 is supplied from the refrigerant tank 22 to the cooling mechanism 1 by a pump 23 to forcibly pass through the nanocapillary channel 6, the heat of the heating element is transferred to the refrigerant 21 at the time of passing, and the refrigerant 21 to which the heat is transferred circulates to the refrigerant tank 22 to be cooled.

Specifically, the refrigerant tank 22 that stores the refrigerant 21 is connected to the pump 23, and the pump 23 is connected to the inlet 7 of the cooling mechanism 1 by the joint 7*a* via a feed pipe 24. The outlet 8 of the cooling mechanism 1 is connected to the refrigerant tank 22 via the joint 8*a* and a return pipe 27. Note that the refrigerant 21 in the refrigerant tank 22 is cooled by a heat sink, a cooling fan, a radiator, or the like (not illustrated) and supplied to the cooling mechanism 1 by the pump 23. In addition, meters such as a filter, a flow meter, a thermometer, and a liquid level meter may be provided.

With the above configuration, the refrigerant 21 is supplied to the inlet 7 of the cooling mechanism 1 via the refrigerant tank 22, the pump 23, the feed pipe 24, and the joint 7*a*. The supplied refrigerant 21 is supplied from the inlet 7 to each nanocapillary channel 6 and moves in each nanocapillary channel 6. Here, since the graphene forming the nanocapillary channel 6 has a thermal conductivity about 10 times that of copper (details will be described later), heat generated by the semiconductor device 10 is accurately transferred to the refrigerant 21 and transferred to the refrigerant tank 22.

In addition, since the nanocapillary channel 6 is excellent in suction force of air, liquid, or the like due to a capillary phenomenon unique to graphene (see FIG. 7 described later for details), the refrigerant 21 moves at a high speed in each nanocapillary channel 6. The refrigerant 21 having passed through each nanocapillary channel 6 returns to the refrigerant tank 22 via the joint 8*a* of the outlet 8 of the cooling mechanism 1 and the return pipe 27. Thereafter, similarly, the refrigerant is sent from the refrigerant tank 22 to the cooling mechanism 1 via the pump 23. Note that, since water (distilled water) can be used as the refrigerant 21, there is an advantage that no special management is required for the refrigerant 21 and the refrigerant is inexpensive and easily available.

Figure 5:
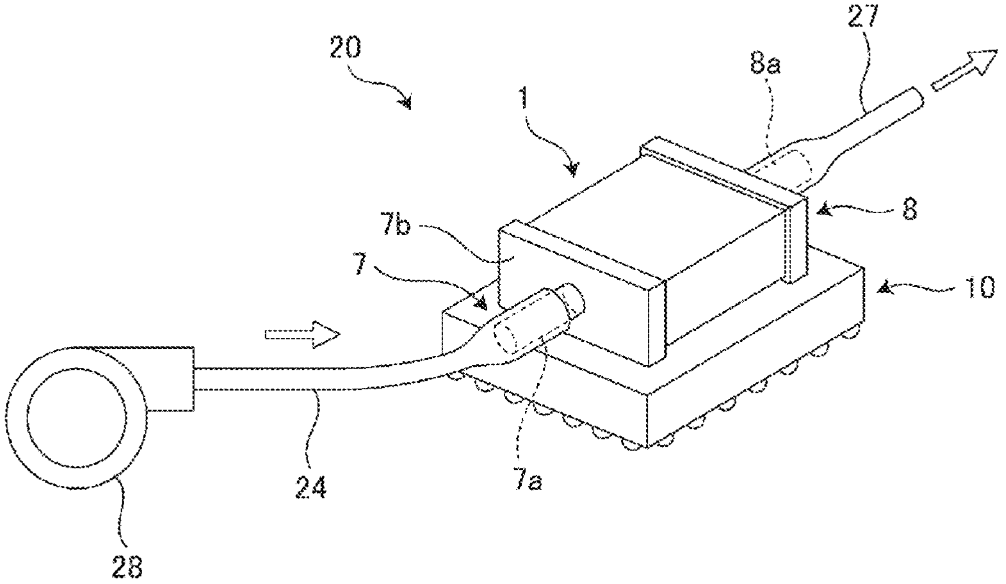
FIG. 5 is a view illustrating a configuration example of an air cooling type cooling method for a semiconductor device using a cooling mechanism according to the present disclosure.

For example, as illustrated in FIG. 5, the air cooling type of forced cooling is configured such that air that is the refrigerant 21 is supplied from a blower 28 to the cooling mechanism 1 to forcibly pass through the nanocapillary channel 6, the heat of the heating element is transferred to the air at the time of passing, and the air that is the refrigerant 21 to which the heat has been transferred is released into the atmosphere to cool.

Specifically, the blower 28 sucks air in the atmosphere and supplies the air to the inlet 7 of the cooling mechanism 1 via the feed pipe 24 and the joint 7*a*. The air which is the supplied refrigerant 21 is supplied from the inlet 7 to each nanocapillary channel 6 and passes through each nanocapillary channel 6. Here, since the graphene forming the nanocapillary channel 6 has excellent thermal conductivity, the graphene accurately transmits the heat generated by the semiconductor device 10 to the air, which is the refrigerant 21, and releases the heat to the atmosphere.

In addition, since the nanocapillary channel 6 is excellent in suction force of air, liquid, or the like due to a capillary phenomenon unique to graphene, the air as the refrigerant 21 moves through each nanocapillary channel 6 at a high speed. The air which is the refrigerant 21 having passed through each nanocapillary channel 6 is discharged to the atmosphere via the joint 8*a* of the outlet 8 of the cooling mechanism 1 and the return pipe 27. Hereinafter, similarly, the blower 28 continuously sends air to the nanocapillary channel 6 of the cooling mechanism 1.

In the case of the air cooling type, since air can be used as the refrigerant 21, there is an advantage that a particularly complicated device or special management is not required. Note that it is desirable to provide an air filter, a silencer in some cases, and the like in the air intake port and the air exhaust port. In addition, as the refrigerant 21, a helium-based rare gas can be used in addition to air. In this case, it is desirable to recover and circulate the gas.

With the above configuration, in the case of liquid cooling type, the refrigerant 21 is supplied to the inlet 7 of the cooling mechanism 1 via the refrigerant tank 22, the pump 23, the feed pipe 24, and the joint 7*a*. The supplied refrigerant 21 is supplied from the inlet 7 to each nanocapillary channel 6 and passes through each nanocapillary channel 6. Here, since the graphene forming the nanocapillary channel 6 has a thermal conductivity about 10 times that of copper, heat generated by the semiconductor device 10 can be accurately transferred to the refrigerant 21, and a temperature rise of the semiconductor device 10 can be suppressed.

In addition, in the case of air cooling type, for example, air is used as the refrigerant 21, so that the graphene forming the nanocapillary channel 6 accurately transmits the heat generated by the semiconductor device 10 to the air, and the temperature rise of the semiconductor device can be suppressed.

With such a configuration, the semiconductor device 10 can be cooled.

Figure 6:
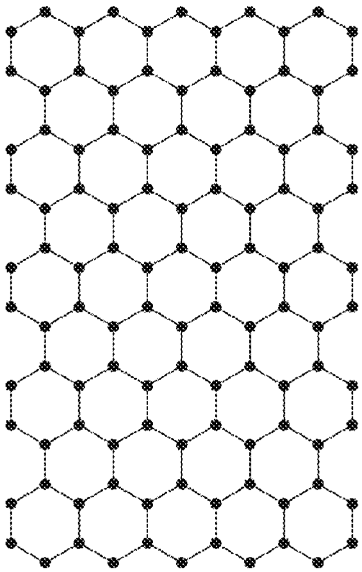
FIG. 6 is a diagram illustrating a structure of graphene used in the cooling mechanism according to the present disclosure.

The graphene in the graphene layers 4 and 5 is a sheet-shaped substance of carbon atoms that forms hybrid orbitals in three directions of 120 degrees each called an sp2 bond having a thickness of one atom. Therefore, the graphene has a hexagonal lattice structure like a honeycomb constituted by carbon atoms and bonds thereof as illustrated in FIG. 6. Since graphene has a thickness of one atom and a carbon-carbon bond distance of graphene is about nm, graphene is extremely thin, lightweight, and flexible. In addition, the electric resistance is 10-6 Ω·cm. This value is even smaller than silver, which is the material having the lowest resistance at room temperature. Moreover, the material has a thermal conductivity of about 10 times that of copper, and is extremely excellent in thermal conductivity. In actual use, layers stacked in a predetermined number of layers are used.

Figure 7:
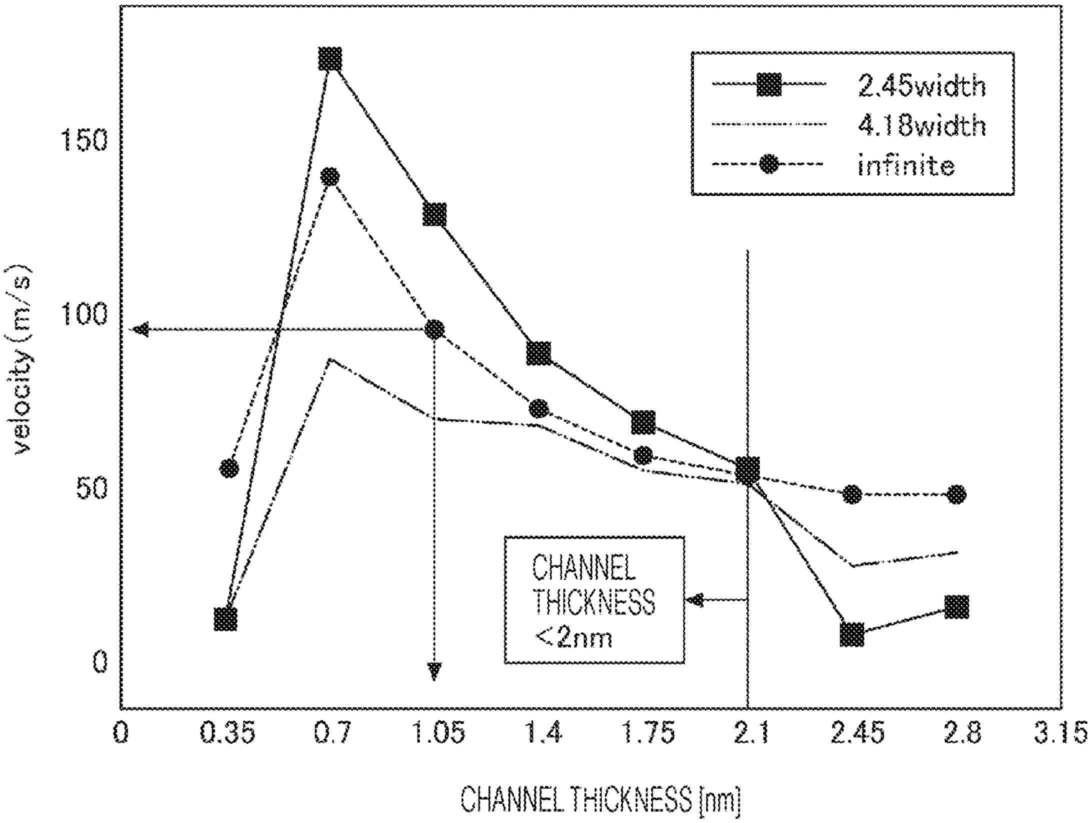
FIG. 7 is a diagram illustrating an average velocity of water moving in a nanocapillary channel.

When the thickness of the nanocapillary channel 6 formed between the graphene layers 4 and 5 is less than 2 nm, the velocity of water moving in the channel rapidly increases due to the capillary phenomenon unique to graphene. For example, in the case of a channel thickness of 1 nm and a width infinite (a width sufficiently large with respect to the channel thickness), the velocity of water moving in the channel is about 100 m/s as illustrated in FIG. 7. This speed corresponds to a speed of 360 km/h, and exceeds that of the Shinkansen. Here, the three graphs in the drawing are the cases where the channel width is 2.45 nm, 4.18 nm, and infinite. As illustrated in the drawing, the velocity of water rapidly increases when the channel width is 2.45 nm and the channel thickness is 2 nm or less.

As described above, it can be seen that the nanocapillary channel 6 sucks water at a rapid speed when the thickness is 2 nm and the width is about the same.

Next, the opening diameter of the nanocapillary channel 6 will be described.

The fine particle "PM 2.5", which has become a hot topic, has a diameter of 2.5 μm or less. The unit is "μ" (micro). On the other hand, since the opening diameter of the nanocapillary channel 6 is, for example, 2 nm×2 nm in the above example, it is about 1/1000 of the PM 2.5. Therefore, the PM 2.5 cannot pass through the opening of the nanocapillary channel 6 at all.

In addition, in a clean room for manufacturing a semiconductor, in the case of Class 1, fine particles of 0.1 μm or more contained in 30 liters of air are 1 or less. Since 0.1 μm is 100 nm, it is about 50 times the opening diameter of the nanocapillary channel 6. Therefore, it is considered that the fine particles that can pass through the opening of the nanocapillary channel 6 do not significantly affect the characteristics of the semiconductor and the like.

As described above, the nanocapillary channel 6 formed in the graphene layer is excellent in the following points in application to the semiconductor device 10.

(1) The thermal conductivity is about 10 times that of copper, and the thermal conductive performance is extremely excellent.

(2) An excellent suction force of air, liquid, and the like is obtained by a capillary phenomenon unique to graphene.

(3) The extremely fine opening diameter prevents passage of fine particles.

The cooling mechanism 1 of the embodiment according to the present disclosure has been made focusing on such excellent characteristics. According to the present disclosure, as described above, the refrigerant 21 moves at a high speed in each nanocapillary channel 6, and the graphene forming the nanocapillary channel 6 has a thermal conductivity about 10 times that of copper, and thus, heat can be accurately transferred to the refrigerant 21, and a temperature rise of the semiconductor device 10 can be suppressed. Hereinafter, each embodiment will be described.

2. Example of Method for Manufacturing Cooling Mechanism According to First Embodiment Next, a method for manufacturing the cooling mechanism 1 according to the first embodiment will be described.

Figure 8A:
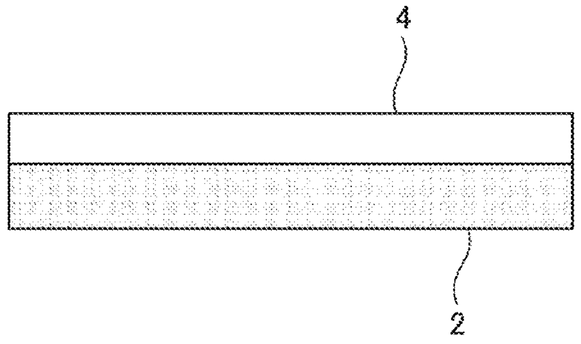
FIGS. 8A and 8B are a cross-sectional view and a plan view respectively (part 1) illustrating the method for manufacturing the cooling mechanism according to the first embodiment.
Figure 8B:
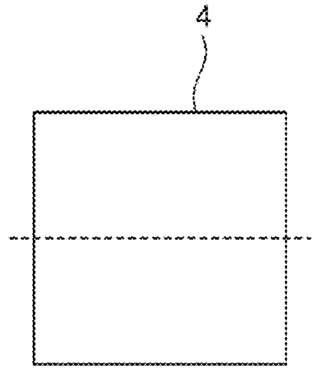

First, as illustrated in the X cross-sectional view of FIG. 8A and the plan view of FIG. 8B, a graphene layer 4 is formed on a copper plate (Cu) 2 by chemical vapor deposition (CVD).

Figure 9C:
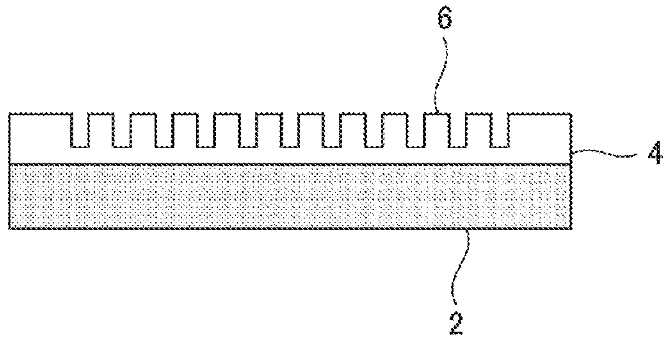
FIGS. 9C and 9 are a cross-sectional view and a plan view respectively part 2) illustrating the method for manufacturing the cooling mechanism according to the first embodiment.
Figure 9D:
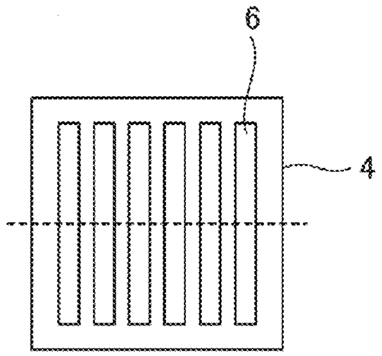

Next, as illustrated in the X cross-sectional view of FIG. 9C and the plan view of FIG. 9D, the nanocapillary channel 6 is formed on the graphene layer 4 by a lithograph and an etching process.

Figure 10E:
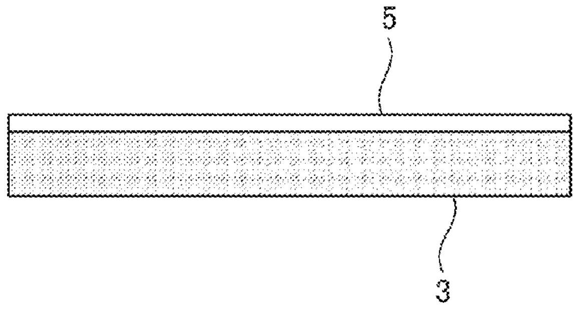
FIGS. 10E and 10F are a cross-sectional view and a plan view respectively (part 3) illustrating the method for manufacturing the cooling mechanism according to the first embodiment.
Figure 10F:
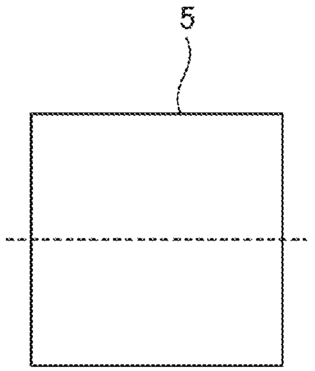

Next, as illustrated in the X cross-sectional view of FIG. 10E and the plan view of FIG. 10F, the graphene layer 5 is separately formed on a copper plate (Cu) 3 by CVD.

Figure 11G:
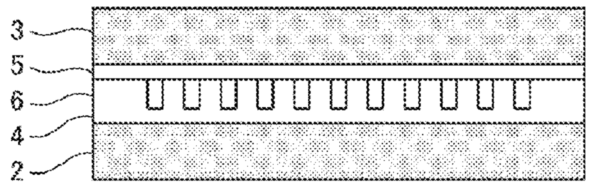
FIGS. 11G and 11H are a cross-sectional view and a plan view respectively (part 4) illustrating the method for manufacturing the cooling mechanism according to the first embodiment.
Figure 11H:
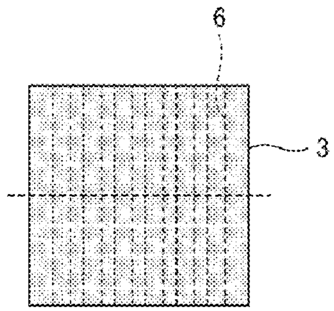

Next, as illustrated in the X cross-sectional view of FIG. 11G and the plan view of FIG. 11H, the copper plate 3 on which the graphene layer 5 is separately formed in FIGS. 10E and F is turned over on the nanocapillary channel 6 formed in FIGS. 9C and D, and the nanocapillary channel 6 of the graphene layer 4 and the graphene layer 5 are joined. The nanocapillary channel 6 and the graphene layer 5 can be bonded by an intermolecular force.

Figure 12J:
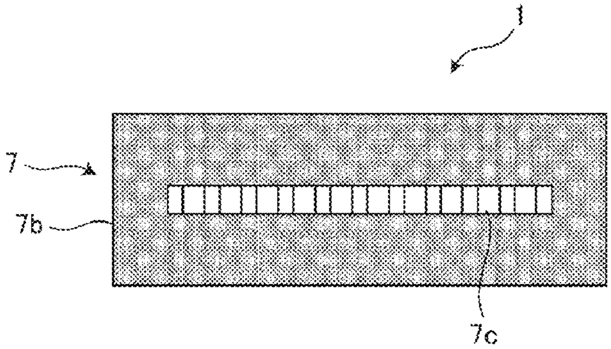
FIGS. 12J and 12K are a front external view and a plan view respectively (part 1) illustrating the method for manufacturing the cooling mechanism according to the first embodiment.
Figure 12K:
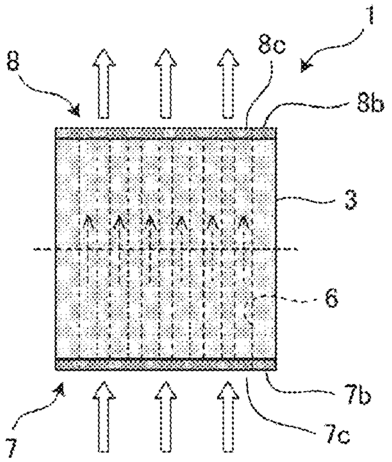

Next, as illustrated in the front external view of FIG. 12J and the plan view of FIG. 12K, lids **7*b* and 8*b* are attached to both the openings 7*c* and 8*c* of each nanocapillary channel 6, respectively. As a result, the cooling mechanism 1 having the inlet 7 and the outlet 8** that can be naturally cooled by natural ventilation is formed.

In addition, as illustrated in the front external view of FIG. 13L and the plan view of FIG. 13M, the lids **7*b* and 8*b* are attached to the openings 7*c* and 8*c* of each nanocapillary channel 6, respectively. The inner surfaces of the lids 7*b* and 8*b* are provided with a gap so as to form a predetermined space so as not to be in close contact with the openings 7*c* and 8*c* of each nanocapillary channel 6. Then, the joints 7*a*, 8*a* are disposed at central portions of the lids 7*b*, 8*b* to form the inlet 7 and the outlet 8. As a result, the cooling mechanism 1 including the inlet 7 and the outlet 8 that can be cooled by being connected to the liquid cooling type or air cooling type cooling device 20** is formed.

By having the above steps, the cooling mechanism 1 according to the first embodiment can be manufactured.

3. Configuration Example of Cooling Mechanism According to Second Embodiment

FIG. 14A is an external perspective view illustrating a basic configuration example of a cooling mechanism 1 according to a second embodiment. As illustrated in the drawing, the cooling mechanism 1 is formed in a substantially rectangular shape. Then, an inlet 7 having a horizontally rectangular shape is placed and fixed on the front surface side of the upper surface of the cooling mechanism 1, and an outlet 8 having a horizontally rectangular shape is placed and fixed on the back surface side of the upper surface with a protective film 9 interposed therebetween.

The inlet 7 and the outlet 8 have an opening 7*c* in the front surface direction and an opening 8*c* in the back surface direction, respectively. As a result, natural cooling by natural ventilation can be performed. Therefore, in the case of natural ventilation, the inlet 7 and the outlet 8 are not necessarily provided.

Figure 14C:
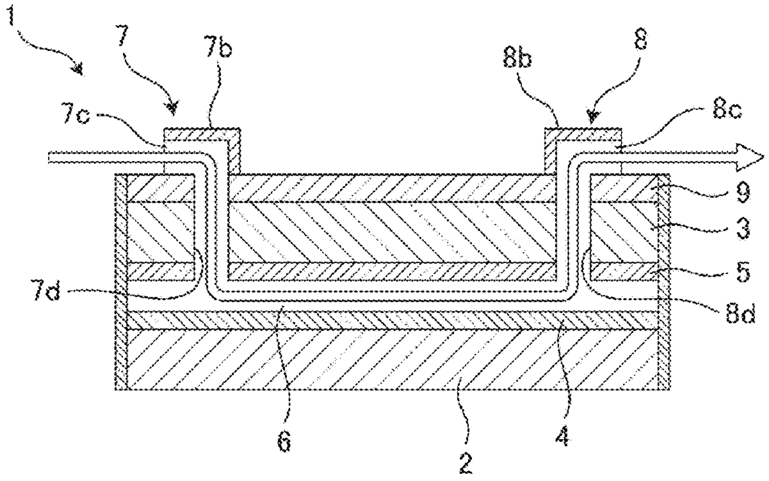

The internal configuration of the cooling mechanism 1 in the width direction is similar to the case of FIG. 1 except for the inlet 7 and the outlet 8 at the X-X line cut portion end surface in FIG. 14A. In addition, as illustrated in FIG. 14C, the Y-Y line cut portion end surface in FIG. 14A communicates with the inside from the opening 7*c* of the inlet 7, and a vent hole 7*d* is formed downward from the opening 7*c* and communicates with the starting end of the nanocapillary channel 6. Then, a vent hole 8*d* is formed upward from the terminal end of the nanocapillary channel 6, and communicates with the outside from the opening 8*c* of the outlet 8. In this way, the opening 7*c* forms a vent hole communicating with the opening 8*c* via the nanocapillary channel 6, and the refrigerant 21 passes through the nanocapillary channel 6 along the arrow.

FIG. 14B is an external perspective view illustrating a configuration example of a modification of the cooling mechanism 1 according to the second embodiment. As illustrated in the drawing, the cooling mechanism 1 is formed in a substantially rectangular shape. Then, instead of providing the openings 7*c* and 8*c* in the horizontal direction, the inlet 7 and the outlet 8 are provided with joints 7*a* and 8*a* for connecting to the cooling device 20 at substantially central portions thereof. In addition, the internal structure of the cooling mechanism 1 illustrated in the drawing forms a passage of the refrigerant 21 communicating from the inlet 7 to the joint 8*a* of the outlet 8 via the nanocapillary channel 6 similarly to that illustrated in FIG. 14C.

As a result, liquid cooling or air cooling by the refrigerant 21 can be performed. That is, when the refrigerant 21 is sucked from the joint 7*a* of the inlet 7, the refrigerant 21 passes through the nanocapillary channel 6 and is discharged from the joint 8*a* of the outlet 8. Configurations other than the above are the same as those of the basic configuration example of the cooling mechanism 1 illustrated in FIG. 14A.

As illustrated in FIG. 4, the cooling mechanism 1 configured as described above can be mounted on the semiconductor device 10, and the refrigerant tank 22 and the pump 23 described in the configuration example of the cooling mechanism 1 according to the first embodiment described above can be connected to the joint 7*a* and the joint 8*a* to configure the liquid cooling type cooling device 20. Then, by circulating the refrigerant 21, the heat generated by the semiconductor device 10 can be transferred to the refrigerant 21 and recovered, and the temperature rise of the semiconductor device 10 can be suppressed. With such a configuration for circulating the refrigerant 21, the semiconductor device 10 can be cooled.

In addition, as illustrated in FIG. 5, the cooling mechanism 1 is mounted on the semiconductor device 10, and the blower 28 described in the configuration example of the cooling mechanism 1 according to the first embodiment is connected to the joint 7*a* and the joint 8*a*, so that the air cooling type cooling device 20 can be configured. Then, by blowing air, heat generated by the semiconductor device 10 can be discharged, and a temperature rise of the semiconductor device 10 can be suppressed. With such a configuration for blowing air, the semiconductor device 10 can be cooled.

In the present embodiment, since the joint 7*a* and the joint 8*a* are erected on the upper surface of the cooling mechanism 1, the feed pipe 24 and the return pipe 27 connected to the refrigerant tank 22, the pump 23, or the blower 28 can be pulled out upward. Therefore, since it is not necessary to perform piping in the lateral direction, it is not necessary to take a space for piping on the printed circuit board in the case of being mounted on the semiconductor device 10 mounted on the printed circuit board (not illustrated), and downsizing of the printed circuit board can be realized.

4. Example of Method for Manufacturing Cooling Mechanism According to Second Embodiment Next, a method for manufacturing the cooling mechanism 1 according to the second embodiment will be described.

Figure 15A:
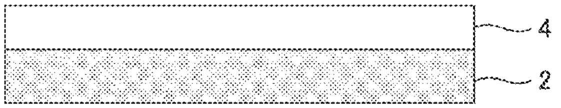
FIGS. 15A and 15B are a cross-sectional view and a plan view respectively (part 1) illustrating the method for manufacturing the cooling mechanism according to the second embodiment.
Figure 15B:
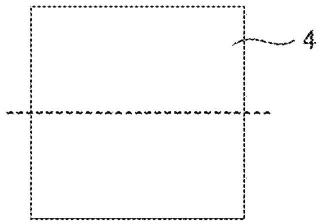

First, as illustrated in the X cross-sectional view of FIG. 15A and the plan view of FIG. 15B, the graphene layer 4 is formed on the copper plate 2 by CVD.

Figure 16C:
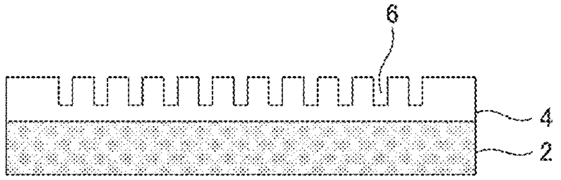
FIGS. 16C and 16D are a cross-sectional view and a plan view respectively (part 2) illustrating the method for manufacturing the cooling mechanism according to the second embodiment.
Figure 16D:
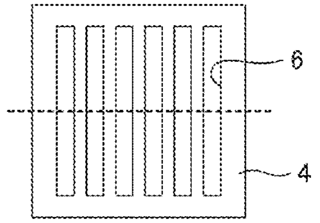

Next, as illustrated in the X cross-sectional view of FIG. 16C and the plan view of FIG. 16D, the nanocapillary channel 6 is formed on the graphene layer 4 by a lithograph and an etching process.

Figure 17E:
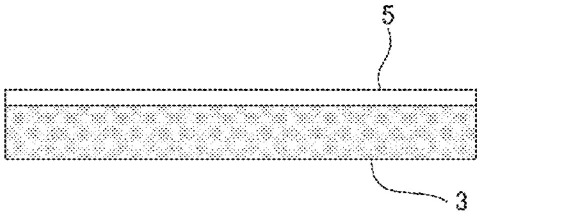
FIGS. 17E and 17F are a cross-sectional view and a plan view respectively (part 3) illustrating the method for manufacturing the cooling mechanism according to the second embodiment.
Figure 17F:
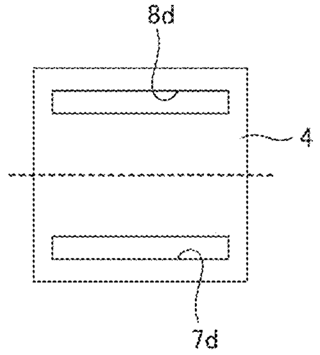

Next, as illustrated in the X cross-sectional view of FIG. 17E and the plan view of FIG. 17F, the graphene layer 5 is separately formed on the copper plate 3 by CVD. Then, as illustrated in FIG. 17F, two vent holes 7*d* and 8*d* are formed in the copper plate 3 on which the graphene layer 5 is formed.

Figure 18G:
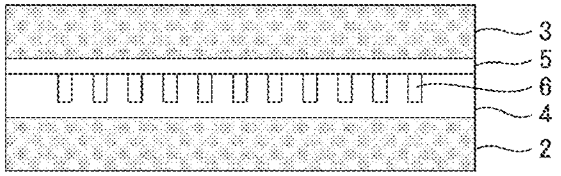
FIGS. 18G and 18H are a cross-sectional view and a plan view respectively (part 4) illustrating the method for manufacturing the cooling mechanism according to the second embodiment.
Figure 18H:
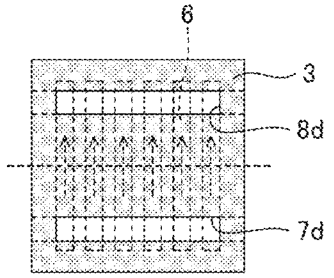

Next, the copper plate 3 on which the graphene layer 5 is separately formed in FIGS. 17E and F is turned over and placed on the nanocapillary channel 6 formed in FIGS. 16C and D. Then, as illustrated in the X cross-sectional view of FIG. 18G and the plan view of FIG. 18H, the nanocapillary channel 6 formed in the graphene layer 4 and the graphene layer 5 are joined. The nanocapillary channel 6 and the graphene layer 5 can be bonded by an intermolecular force.

Figure 19J:
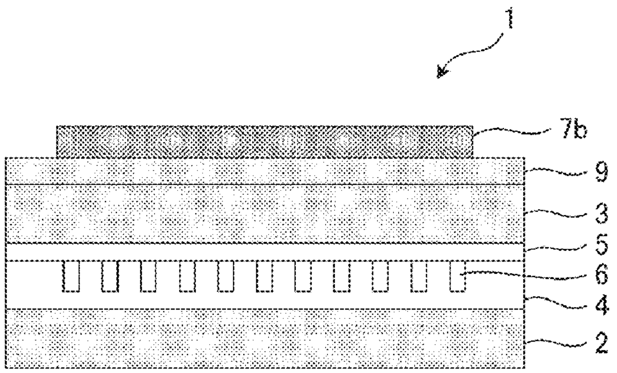
FIGS. 19J and 19K are a cross-sectional view and a plan view respectively (part 5) illustrating the method for manufacturing the cooling mechanism according to the second embodiment.
Figure 19K:
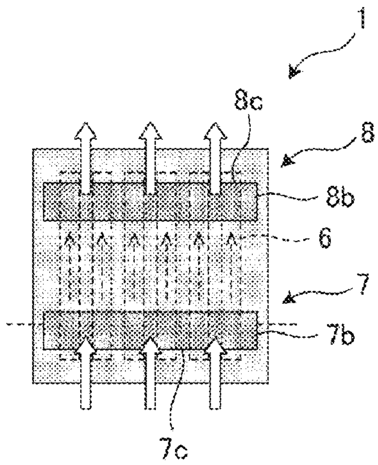

Next, as illustrated in the X cross-sectional view of FIG. 19J and the plan view of FIG. 19K, a protective film 9 is formed on the copper plate 3. Then, the lids 7*b* and 8*b* provided with the openings 7*c* and 8*c* in the horizontal direction on the respective upper surfaces of the vent holes 7*d* and 8*d* are mounted and fixed in the front surface direction and the back surface direction to form the inlet 7 and the outlet 8. As a result, natural cooling by natural ventilation can be performed.

In addition, as illustrated in FIG. 14B, in the inlet 7 and the outlet 8, joints 7*a* and 8*a* for connecting to the cooling device 20 can be erected at substantially central portions of the respective lids 7*b* and 8*b* instead of providing the openings 7*c* and 8*c* in the horizontal direction. As a result, forced cooling by liquid cooling type or air cooling type can be performed.

By having the above steps, the cooling mechanism 1 according to the second embodiment can be manufactured. In the manufacturing method according to the present embodiment, the components of the inlet 7 and the outlet 8 are only required to be stacked in order on the upper surface of the copper plate 3 with the protective film 9 interposed therebetween to be assembled, so that there is an advantage that the operation content is clear and the operation is easy.

5. Configuration Example of Cooling Mechanism According to Third Embodiment

Figure 20:
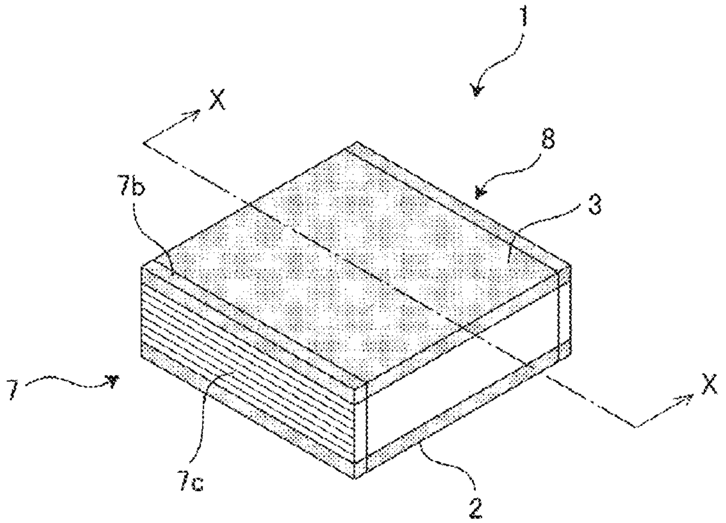
FIG. 20 is an external perspective view illustrating a configuration example of a cooling mechanism according to a third embodiment.

FIG. 20 is an external perspective view illustrating a configuration example of a cooling mechanism 1 according to a third embodiment. As illustrated in the drawing, the cooling mechanism 1 is formed in a substantially rectangular shape. Then, the inlet 7 is provided on the front surface, and the outlet 8 is provided on the back surface.

Figure 21A:
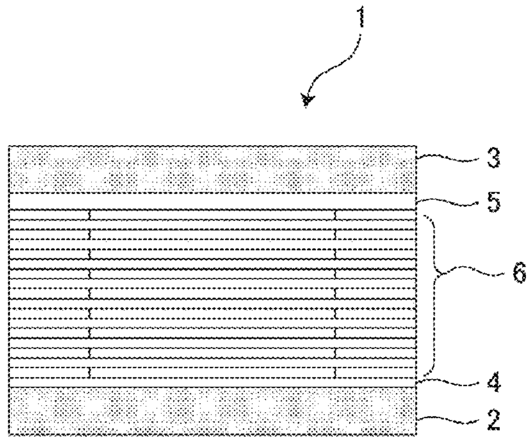
FIGS. 21A and 21B are a cross-sectional view and a plan view respectively illustrating the configuration example of the cooling mechanism according to the third embodiment.
Figure 21B:
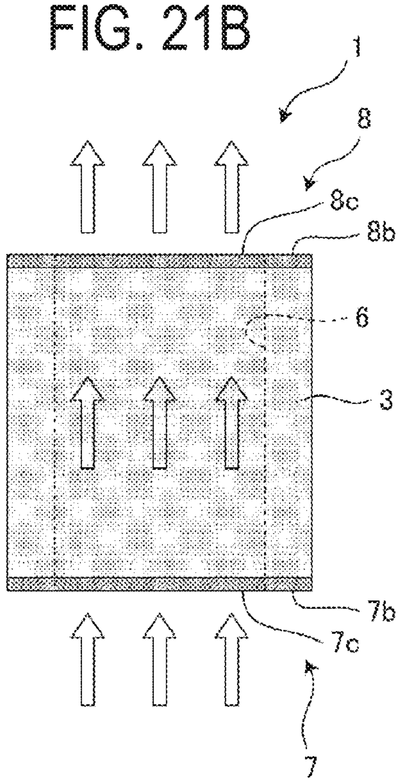

FIGS. 21A and 21B are a cross-sectional view and a plan view respectively of an X-X line cut portion end surface of the configuration example of FIG. 20. In the internal configuration of the cooling mechanism 1 in the width direction, as illustrated in FIG. 21A, nanocapillary channels 6 having a wide width are formed in multiple layers between graphene layers 4 and 5 sandwiched between copper plates 2 and 3 disposed vertically. In addition, in the internal configuration of the cooling mechanism 1, as illustrated in FIG. 21B, the nanocapillary channels 6 having a wide width penetrates from the inlet 7 to the outlet 8 to form vent holes.

Since the cooling mechanism 1 according to the present disclosure is configured as described above, natural cooling by natural ventilation can be performed.

In addition, as illustrated in FIGS. 14A and C, the inlet 7 and the outlet 8 may be provided with the vent holes 7*d* and 8*d* communicating with the nanocapillary channels 6, and the lids 7*b* and 8*b* provided with the openings 7*c* and 8*c* in the horizontal direction on the respective upper surfaces may be placed and fixed in the front surface direction and the back surface direction to form the inlet 7 and the outlet 8.

In addition, in the case of forced cooling, the joints 7*a* and 8*a* may be protruded or erected on the inlet 7 and the outlet 8 (see FIG. 13L, M, or FIG. 14B for external shape). Whether the joints 7*a* and 8*a* are provided in a protruding manner or in an erected manner is only required to be determined according to the layout or the like of the semiconductor device 10 to be mounted.

In the case of the liquid cooling type of forced cooling, for example, it is preferable to connect to the cooling device 20 as illustrated in FIG. 4. In addition, in the case of the air cooling type, for example, it is preferable to connect to the cooling device 20 as illustrated in FIG. 1*n* any case of cooling method, the refrigerant 21 sucked from the inlet 7 is transferred with heat generated by the semiconductor device 10 when passing through the wide nanocapillary channels 6 formed in multiple layers, and is discharged from the outlet 8.

Since the cooling mechanism 1 according to the present disclosure is configured as described above, the cooling mechanism 1 can cool the semiconductor device 10 by being mounted on the semiconductor device 10 and connecting to the cooling device 20 to circulate the refrigerant 21 as described above. This point is similar to that of the first embodiment and the second embodiment, and thus the description thereof will be omitted.

As described above, in the present embodiment, the circulation amount of the refrigerant 21 can be increased by forming the wide nanocapillary channels 6 in multiple layers. As a result, it is possible to more accurately transmit a large amount of heat to the refrigerant 21 and suppress a temperature rise of the semiconductor device 10.

6. Example of Method for Manufacturing Cooling Mechanism According to Third Embodiment Next, a method for manufacturing the cooling mechanism 1 according to the third embodiment will be described.

Figure 22A:
FIGS. 22A and 22B are a cross-sectional view and a plan view respectively (part 1) illustrating the method for manufacturing the cooling mechanism according to the third embodiment.
Figure 22B:
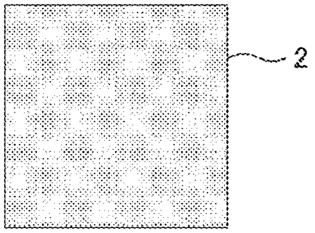

First, the copper plate 2 is prepared as illustrated in the X cross-sectional view of FIG. 22A and the plan view of FIG. 22B.

Figure 23C:
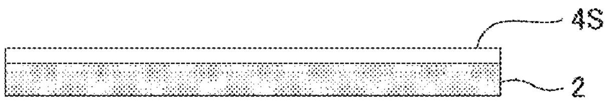
FIGS. 23C and 23D are a cross-sectional view and a plan view respectively (part 2) illustrating the method for manufacturing the cooling mechanism according to the third embodiment.
Figure 23D:
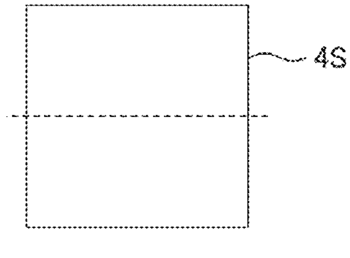

Next, as illustrated in the X cross-sectional view of FIG. 23C and the plan view of FIG. 23D, a graphene sheet 4S is bonded onto the copper plate 2.

Figure 24E:
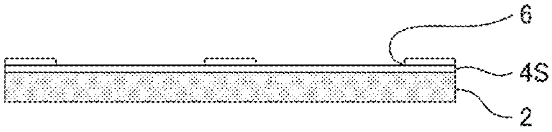
FIGS. 24E and 24F are a cross-sectional view and a plan view respectively (part 3) illustrating the method for manufacturing the cooling mechanism according to the third embodiment.
Figure 24F:
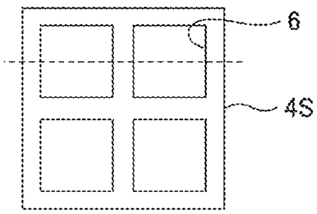

Next, as illustrated in the X cross-sectional view of FIG. 24E and the plan view of FIG. 24F, wide nanocapillary channels 6*a* are patterned into substantially equal quarters on the graphene sheet 4S by a lithographic and etching process. Note that the pattern of the nanocapillary channels 6*a* of the present embodiment will be described as a pattern having a large width as illustrated in FIG. 24F, it may be a line & space (L/S) pattern.

Figure 25G:
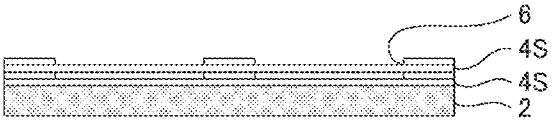
FIGS. 25G and 25H are a cross-sectional view and a plan view respectively (part 4) illustrating the method for manufacturing the cooling mechanism according to the third embodiment.
Figure 25H:
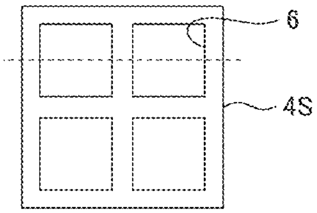

Next, as illustrated in the X cross-sectional view of FIG. 25G and the plan view of FIG. 25H, the graphene sheet 4S is further bonded onto the nanocapillary channels 6*a*. The nanocapillary channels 6*a* and the graphene sheet 4S are easily joined by intermolecular force. After bonding, the wide nanocapillary channels 6*a* are patterned in substantially equal quarters on the graphene sheet 4S in a similar manner to that in FIGS. 24E and F by a lithographic and etching process.

Hereinafter, by repeating similar steps, the wide nanocapillary channels 6 are sequentially layered on the wide nanocapillary channels 6 formed on the graphene sheet 4S on the copper plate 2.

Figure 26J:
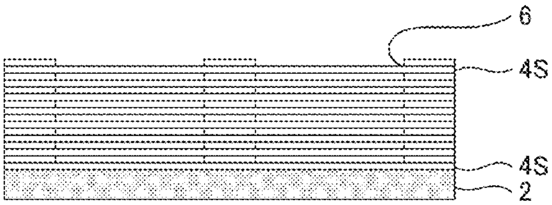
FIGS. 26J and 26K are a cross-sectional view and a plan view respectively (part 5) illustrating the method for manufacturing the cooling mechanism according to the third embodiment.
Figure 26K:
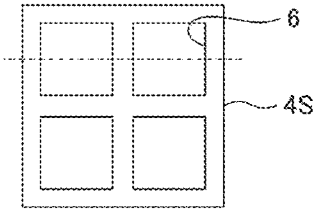

As a result, as illustrated in the X cross-sectional view of FIG. 26J and the plan view of FIG. 26K, the wide multilayer nanocapillary channels 6 formed on the graphene sheet 4S are formed.

Figure 27L:
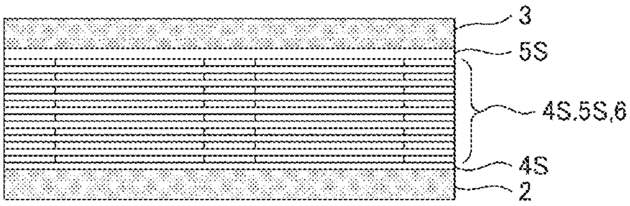
FIGS. 27L and 27M are a cross-sectional view and a plan view respectively (part 6) illustrating the method for manufacturing the cooling mechanism according to the third embodiment.
Figure 27M:
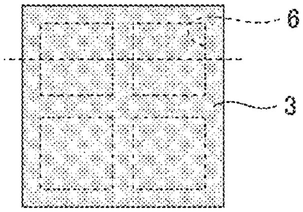

In addition, the graphene sheet 5S is bonded onto the copper plate 3 by the steps illustrated in FIGS. 22A and B to 26J and K to form another wide multilayer nanocapillary channel 6 having a wide width. Then, this is turned over and placed on the multilayer nanocapillary channel 6 formed as illustrated in FIGS. 26J and K described above. Then, as illustrated in the X cross-sectional view of FIG. 27L and the plan view of FIG. 27M, the nanocapillary channel 6 and the graphene sheet 4S are joined. The nanocapillary channel 6 and the graphene sheet 4S can be bonded by an intermolecular force.

Figure 28P:
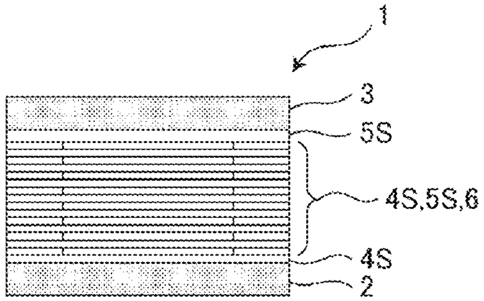
FIGS. 28P and 28Q are a cross-sectional view and a plan view respectively (part 7) illustrating the method for manufacturing the cooling mechanism according to the third embodiment.
Figure 28Q:
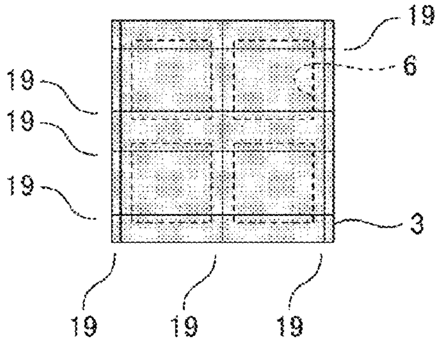

By the manufacturing process as described above, four main body portions of the cooling mechanism 1 are formed. Therefore, as illustrated in the plan view of FIG. 28Q, dicing is performed along cut lines 19 indicated by broken lines in the drawing. As a result, it is possible to obtain main body portions of the cooling mechanism 1 diced as illustrated in the X cross-sectional view of FIG. 28P.

Next, as illustrated in FIG. 20, the lids 7*b* and 8*b* having the openings 7*c* and 8*c* on the front surface and the back surface are mounted.

In addition, similarly to the second embodiment, the inlet 7 and the outlet 8 may be formed by providing the vent holes 7*d* and 8*d* in the wide nanocapillary channels 6 formed in multiple layers and mounting and fixing the lids 7*b* and 8*b* provided with the openings 7*c* and 8*c* in the horizontal direction on the respective upper surfaces of the vent holes 7*d* and 8*d* in the front surface direction and the back surface direction.

In addition, a step of attaching the inlet 7 and the outlet 8 (see FIG. 13L, M, or FIG. 14B for external shape) in which the joints 7*a* and 8*a* are protruded or erected for forced cooling may be provided. Note that the joints 7*a* and 8*a* may protrude in the horizontal direction or may be erected upward depending on the injection direction of the refrigerant 21. In addition, both may be combined.

By having the above steps, the cooling mechanism 1 according to the third embodiment can be manufactured. In the manufacturing method according to the present embodiment, since the multilayer nanocapillary channel 6 having a wide width is formed and laminated, it is not necessary to form the nanocapillary channel 6 having a narrow width. The process can be simplified.

7. Configuration Example of Cooling Mechanism According to Fourth Embodiment The difference in configuration between a cooling mechanism 1 according to a fourth embodiment and the first embodiment and the second embodiment is that, as illustrated in the plan view of FIG. 29B, the nanocapillary channel 6 has an air vent hole 33 communicating with another space.

As illustrated in the external perspective views of FIGS. 1 and 13, the configuration of the cooling mechanism 1 according to the present embodiment is basically similar to the configuration example of the cooling mechanism 1 according to the first embodiment or the second embodiment. That is. As illustrated in FIG. 1, it is formed in a substantially rectangular shape. Then, the inlet 7 is provided on the front surface, and the outlet 8 is provided on the back surface.

Alternatively, similarly to FIG. 14 in the second embodiment, the vent holes 7*d* and 8*d* may be provided in the nanocapillary channel 6, and the lids 7*b* and 8*b* provided with the openings 7*c* and 8*c* in the horizontal direction on the respective upper surfaces of the vent holes 7*d* and 8*d* may be placed and fixed in the front surface direction and the back surface direction to form the inlet 7 and the outlet 8.

Figure 29A:
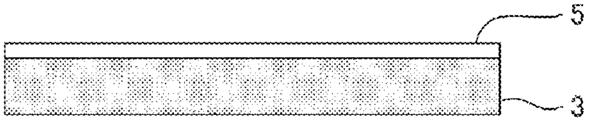
FIGS. 29A and 29B are a cross-sectional view and a plan view respectively illustrating one step of the method for manufacturing a cooling mechanism according to a fourth embodiment.
Figure 29B:
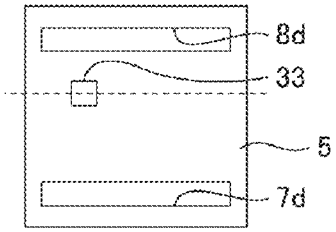

The flow of the refrigerant 21 by providing the air vent hole 33 as illustrated in FIG. 29B will be described below.

The refrigerant 21 entering from the inlet 7 moves in the nanocapillary channel 6 and is discharged from the outlet 8 similarly to the case of the first embodiment. However, since the air vent hole 33 is provided in the copper plate 3 and the graphene layer 5 on the upper surface, in a case where a space such as a hollow cabin is formed on the copper plate 3, the space and the path of the refrigerant 21 communicate with each other. Then, the space such as a hollow cabin communicates with an external space via the nanocapillary channel 6, so that so-called "breathing" is possible.

Figure 30A:
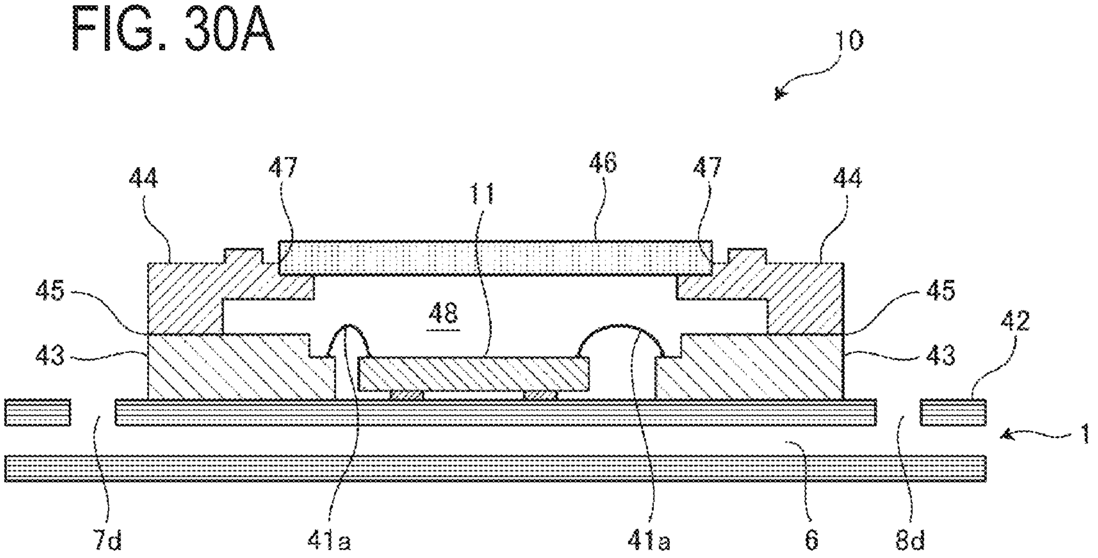
FIGS. 30A and 30B are a cross-sectional view and a plan view respectively of a semiconductor device using the cooling mechanism according to the fourth embodiment.

Hereinafter, a specific configuration example will be described. FIG. 30A is an X cross-sectional view in which the semiconductor device 10 is mounted on the cooling mechanism 1 according to the present embodiment. As illustrated in the drawing, the semiconductor device 10 is a solid-state imaging device of an FBGA package adopting wire bonding connection. In the drawing, the ceramic package substrate of the semiconductor device 10 is replaced with the cooling mechanism 1 according to the present embodiment.

In the drawing, a wiring layer 42 is disposed on the cooling mechanism 1 with a protective film 9 interposed therebetween, and a semiconductor chip 11 is bonded to a substantially central portion of the wiring layer 42. The BGA disposed on the lower surface of the semiconductor chip 11 is electrically connected to a predetermined pad of the wiring layer 42. In addition, a rewiring layer 43 is disposed on the peripheral surface of the semiconductor chip 11, and a predetermined pad of the semiconductor chip 11 and a predetermined pad of the rewiring layer 43 are wire-bonded by, for example, a gold wire 11*a* to form a circuit.

Figure 30B:
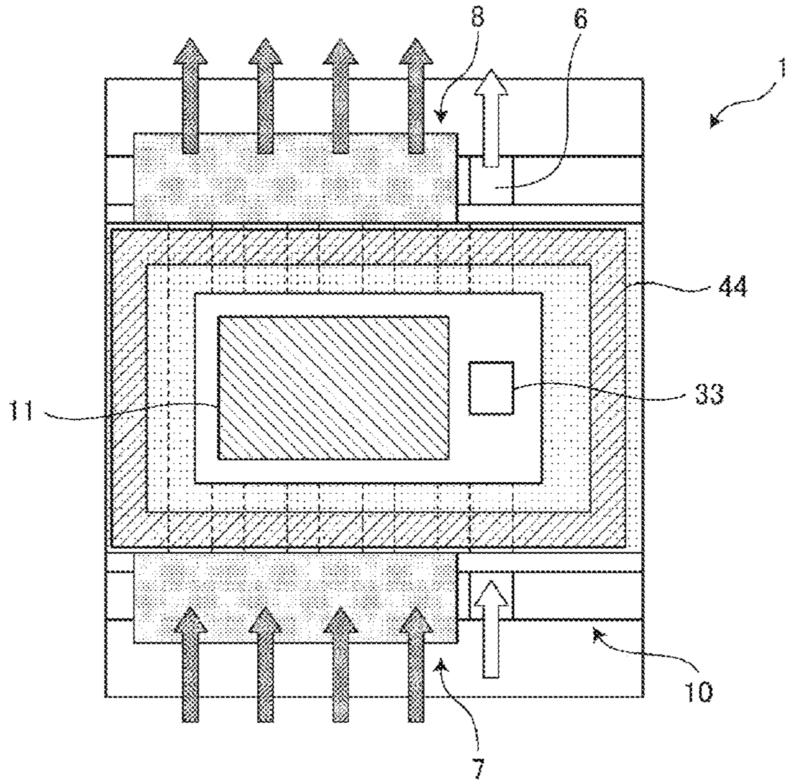

A frame 44 is bonded to the upper surface of the rewiring layer 43 with a frame mount sealing resin 45, and surrounds the rewiring layer 43 as illustrated in the plan view of FIG. 30B. Then, a cover glass 46 is placed so as to cover the upper peripheral surface of the quadrangle formed to be surrounded by the frame 44, and is bonded to the frame 44 by a sealing glass resin 47. As a result, the space in which the semiconductor chip 11 is disposed forms a hollow cavity 48 which is an airtight space.

As described above, the package of the semiconductor device 10 has a hollow cavity structure. That is, the hollow cavity 48 has an airtight structure so that dust, moisture, and the like do not enter the hollow cavity. However, when such an airtight structure is configured, there is a concern that the air in the hollow cavity 48 expands and the internal pressure rises at a high temperature, and a stress is applied to each bonding portion to cause a problem such as peeling. For example, when the substrate is mounted on a printed circuit board, if the substrate is passed through a reflow furnace for reflow soldering, the substrate may be temporarily exposed to a high temperature of 260° C. for a short time. In such a case, since the internal pressure in the hollow cavity 48 rapidly increases, the sealing material needs to withstand this. In addition, there is a concern that moisture accumulates (hardly escapes) and dew condensation or fogging occurs in a high-humidity environment, and the function of the solid-state imaging device is lost.

The present embodiment has been made by particularly focusing on the point that "(3) it prevents passage of fine particles since it has an extremely fine opening diameter", which is a feature of the nanocapillary channel constituted by the graphene. Specifically, as illustrated in FIG. 30A, by providing the air vent hole 33 in the copper plate 3 on which the graphene layer 5 is formed, the nanocapillary channel 6 can be used as a breathing hole between the hollow cavity 48 and the external space. As a result, it is possible to solve the above-described problem that has been a long standing problem.

In addition, by forming the air vent hole 33 as a breathing hole between the hollow cavity 48 and the external space via the nanocapillary channel 6, the following innovative effect is obtained.

(1) Since breathing is possible between the hollow cavity 48 and the external space, air and moisture inside the hollow cavity 48 can be directly discharged to the outside, and peeling, warpage, and the like due to condensation prevention and internal pressure expansion are suppressed.

(2) Since the nanocapillary channel 6 has an extremely fine opening diameter, there is no concern about dust having a size that causes a defect in a solid-state imaging device.

(3) Since it is not necessary to consider moisture permeability, the degree of freedom in selecting characteristics, sizes, shapes, and the like of the frame mount sealing resin 45, the sealing glass resin 47, and the like increases.

That is, conventionally, there are various restrictions on the selection of the sealing resin, but since it is not necessary to consider moisture permeability, these restrictions are removed. In addition, conventionally, when the cover glass 46 is bonded and sealed, it has been necessary to tune temperature, humidity, atmospheric pressure, and the like, but such restrictions on quality control can also be relaxed. Further, the frame 44 can be downsized, and the spreading effect is extremely remarkable. Note that, in a case where the air vent hole 33 is used as a breathing hole, the air vent hole is only required to be disposed anywhere and it is only required to be determined from the entire layout.

8. Example of Method for Manufacturing Cooling Mechanism According to Fourth Embodiment Next, a method for manufacturing the cooling mechanism 1 according to the fourth embodiment will be described.

The method for manufacturing the cooling mechanism 1 according to the present embodiment is different from the method for manufacturing the cooling mechanism 1 according to the first embodiment and the second embodiment in that, as illustrated in the plan view of FIG. 29B, the nanocapillary channel 6 has a step of forming the air vent hole 33 communicating with another space.

That is, in the steps illustrated in FIGS. 10E and F of the first embodiment described above, the graphene layer 5 is separately formed on the copper plate 3 by CVD. At that time, as illustrated in FIG. 29B, a step of providing an air vent hole 33 in the copper plate 3 on which the graphene layer 5 is formed is included.

Alternatively, in the steps illustrated in FIGS. 17E and F of the second embodiment described above, the graphene layer 5 is separately formed on the copper plate 3 by CVD. Then, as illustrated in FIG. 17F, two vent holes 7*d* and 8*d* are formed in the copper plate 3 on which the graphene layer 5 has been formed. At that time, as illustrated in FIG. 29B, a step of providing the air vent hole 33 in the copper plate 3 on which the graphene layer 5 is formed is included.

Since the manufacturing process other than the above is similar to the method for manufacturing the cooling mechanism 1 according to the first embodiment or the second embodiment, the description thereof will be omitted.

9. Example of Method for Manufacturing Semiconductor Device Equipped with Cooling Mechanism According to First Embodiment Next, a method for manufacturing the semiconductor device 10 on which the cooling mechanism 1 according to the first embodiment is mounted will be described.

Figure 31A:
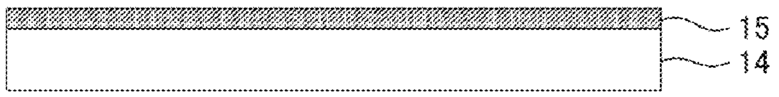
FIGS. 31A, 31B and 31C are cross-sectional views (part 1) illustrating the method for manufacturing the semiconductor device on which the cooling mechanism according to the first embodiment is mounted.

First, a first insulating layer 15 is formed on silicon or a first glass substrate 14 as illustrated in an X cross-sectional view of FIG. 31A.

Figure 31B:
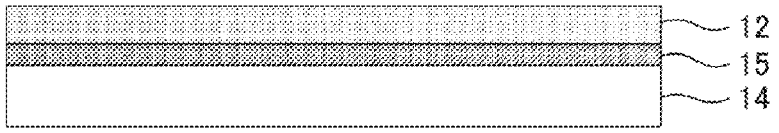

Next, as illustrated in the X cross-sectional view of FIG. 31B, a copper layer 12 as a first metal layer is formed on the first insulating layer 15 by CVD.

Figure 31C:
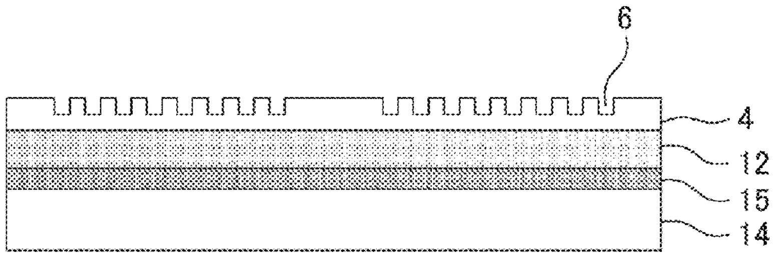

Next, as illustrated in the X cross-sectional view of FIG. 31C, the first graphene layer 4 is formed on the first copper layer 12 by CVD. Then, the nanocapillary channel 6 is formed on the first graphene layer 4 by a lithography and an etching process.

Figure 32D:
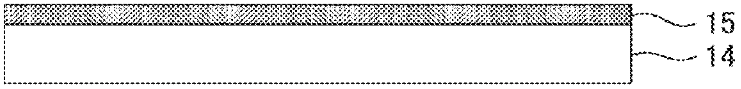
FIGS. 32D and 32E are cross-sectional views (part 2) illustrating the method for manufacturing the semiconductor device on which the cooling mechanism according to the first embodiment is mounted.

Next, as separately illustrated in the X cross-sectional view of FIG. 32D, the second insulating layer 15 is formed on silicon or a second glass substrate 14.

Figure 32E:
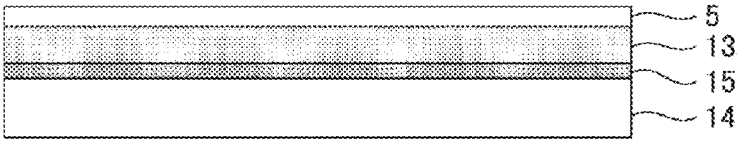

Next, as illustrated in the X cross-sectional view of FIG. 32E, a copper layer 13 as a second metal layer and a second graphene layer 5 are formed on the second insulating layer 15 by CVD.

Figure 33F:
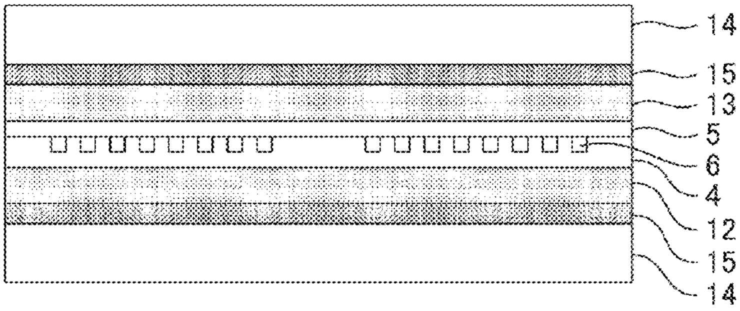
FIGS. 33F and 33G are cross-sectional views (part 3) illustrating the method for manufacturing the semiconductor device on which the cooling mechanism according to the first embodiment is mounted.

Next, in FIG. 31C, on the nanocapillary channel 6 formed on the first glass substrate 14, the silicon or the second glass substrate 14 on which the second graphene layer 5 and the second copper layer 13 are separately formed by CVD in FIG. 32E is turned over and bonded as illustrated in the X cross-sectional view of FIG. 33F. The nanocapillary channel 6 and the second graphene layer 5 can be bonded by an intermolecular force.

Figure 33G:
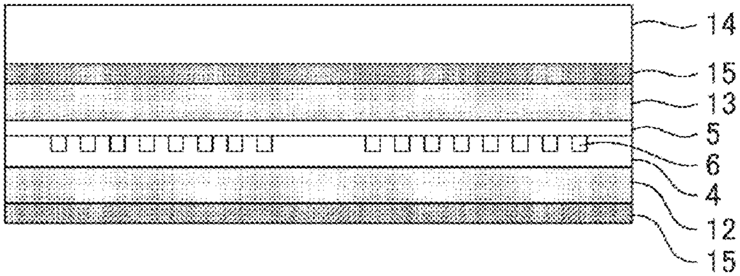

Next, as illustrated in the X cross-sectional view of FIG. 33G, the first glass substrate 14 is removed by backgrind (BG) or chemical mechanical polishing (CMP). In this way, a nanocapillary channel substrate is formed.

Figure 34H:
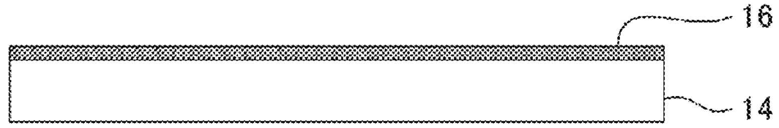
FIGS. 34H, 34J and 34K are cross-sectional views (part 4) illustrating the method for manufacturing the semiconductor device on which the cooling mechanism according to the first embodiment is mounted.

Next, as illustrated in the X cross-sectional view of FIG. 34H, a first adhesive layer 16 is separately formed on a third glass substrate 14.

Figure 34J:
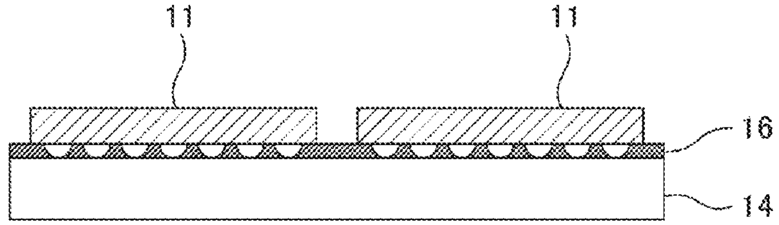

Next, as illustrated in the X cross-sectional view of FIG. 34J, the semiconductor chip 11 of KGD is rearranged on the first adhesive layer 16.

Figure 34K:
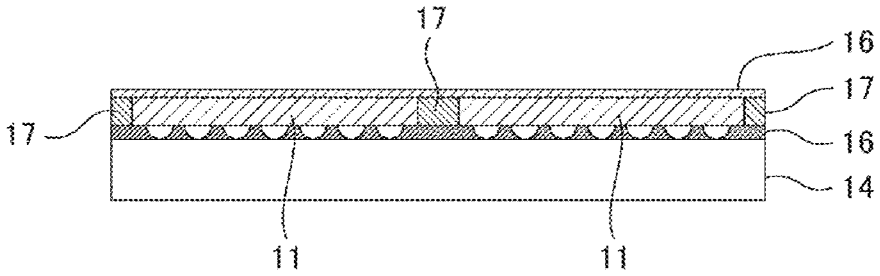

Next, as illustrated in the X cross-sectional view of FIG. 34K, the space between the semiconductor chips 11 is filled with a molding resin 17. Then, thinning and surface flattening are performed by CMP. Thereafter, the second adhesive layer 16 is formed on the upper surface thereof.

Figure 35L:
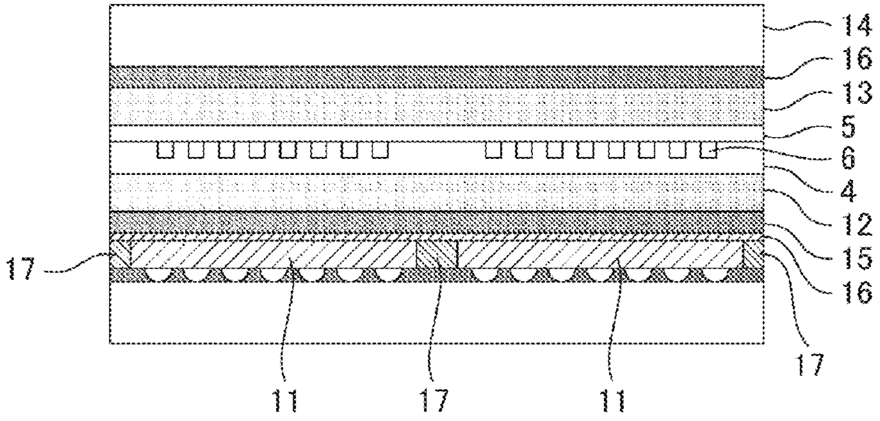
FIGS. 35L and 35M are cross-sectional views (part 5) illustrating the method for manufacturing the semiconductor device on which the cooling mechanism according to the first embodiment is mounted.

Next, as illustrated in the X cross-sectional view of FIG. 35L, the nanocapillary channel substrate formed in FIG. 33G is bonded to the upper surface of the second adhesive layer 16 formed on the upper surface of the semiconductor chip 11 bonded onto the third glass substrate 14.

Figure 35M:
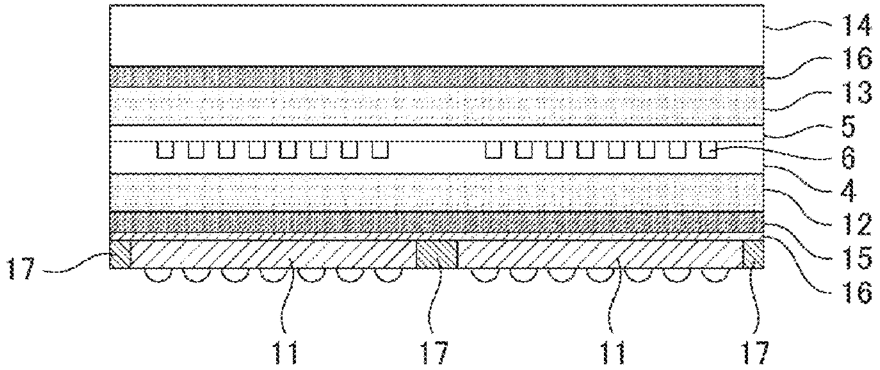

Next, as illustrated in the X cross-sectional view of FIG. 35M, the third glass substrate 14 is debonded and removed, and the remaining first adhesive layer 16 is cleaned and removed.

Figure 36N:
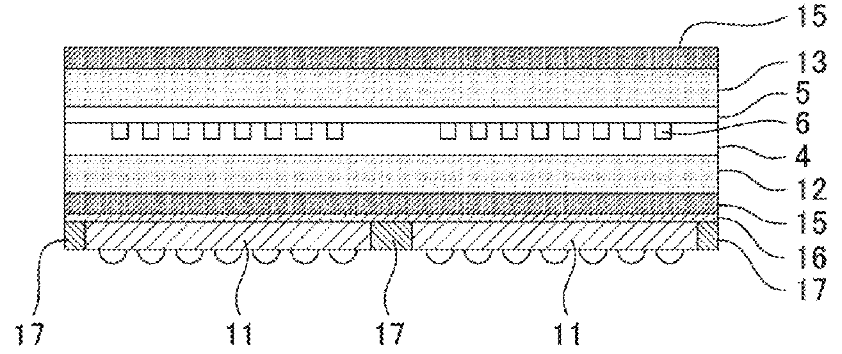
FIGS. 36N and 36P are cross-sectional views (part 6) illustrating the method for manufacturing the semiconductor device on which the cooling mechanism according to the first embodiment is mounted.

Next, as illustrated in the X cross-sectional view of FIG. 36N, the semiconductor chip 11 is attached to a backgrind (BG) tape (not illustrated) with the bump side facing down to protect the surface. Then, the silicon or the second glass substrate 14 is removed by BG or CMP.

Figure 36P:
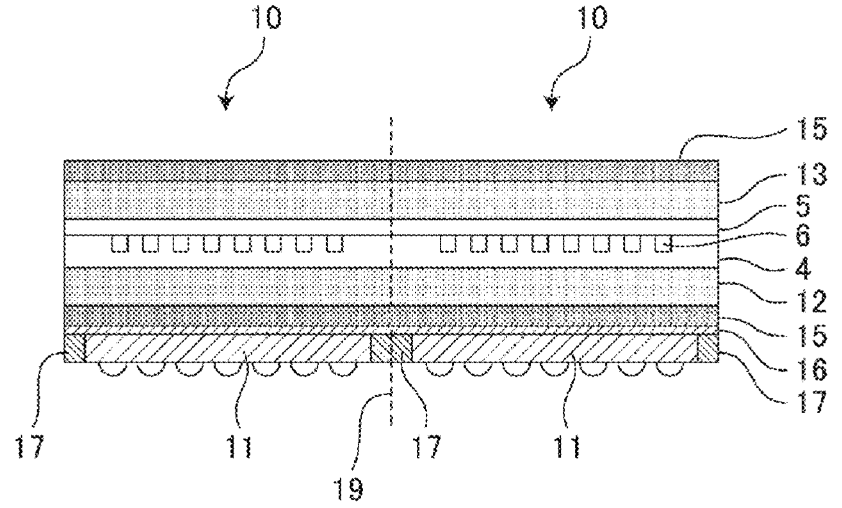

Next, as illustrated in the X cross-sectional view of FIG. 36P, the sheet is diced along a cut line 19. After processing, the BG tape is removed.

Figure 37Q:
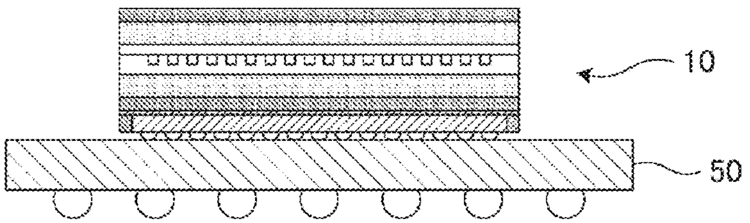
FIGS. 37Q and 37R are cross-sectional views (part 7) illustrating the method for manufacturing the semiconductor device on which the cooling mechanism according to the first embodiment is mounted.

Next, as illustrated in the X cross-sectional view of FIG. 37Q, the semiconductor device 10 on which the cooling mechanism 1 having the diced nanocapillary channels 6 is mounted is mounted on the PKG substrate (package substrate) 50. Thereafter, the lids 7*b* and 8*b* having the openings 7*c* and 8*c* are attached to the front surface and the back surface of each nanocapillary channel 6 of the cooling mechanism 1.

In addition, as illustrated in FIGS. 13L and M, a step of forming the inlet 7 by disposing the joints 7*a* and 8*a* at the central portions of the lids 7*b* and 8*b* may be provided.

Through the above steps, the semiconductor device 10 on which the cooling mechanism 1 according to the first embodiment is mounted can be manufactured.

10. Example of Method for Manufacturing Semiconductor Device Equipped with Cooling Mechanism According to Second Embodiment Next, a method for manufacturing the semiconductor device 10 on which the cooling mechanism 1 according to the second embodiment is mounted will be described. The method for manufacturing the cooling mechanism 1 according to the present embodiment is different from the method for manufacturing the cooling mechanism 1 according to the first embodiment in that, as illustrated in FIG. 37R, the method includes a step of forming the two vent holes 7*d* and 8*d* described in FIG. 17F in the step of FIG. 32E, and a step of forming the inlet 7 and the outlet 8 by mounting and fixing the lids 7*b* and 8*b* provided with the openings 7*c* and 8*c* in the horizontal direction on the respective upper surfaces of the vent holes 7*d* and 8*d* in the front surface and back surface directions.

Figure 37R:
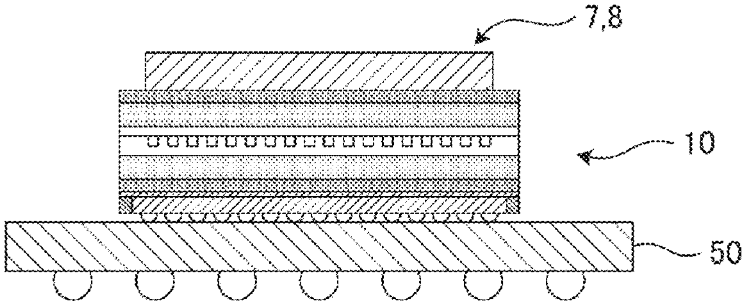

FIG. 37R is a view of an X-X line cut end surface of the semiconductor device 10 on which the cooling mechanism 1 according to the second embodiment is mounted. As can be seen from the drawing, the present embodiment is different from FIG. 37Q according to the first embodiment in that the inlet 7 and the outlet 8 are placed and fixed on the upper surface. Since the points other than the above are similar to the method for manufacturing the semiconductor device 10 on which the cooling mechanism 1 according to the first embodiment is mounted, the description thereof will be omitted.

11. Example of Method for Manufacturing Semiconductor Device Equipped with Cooling Mechanism According to Third Embodiment Next, a method for manufacturing the semiconductor device 10 on which the cooling mechanism 1 according to the third embodiment is mounted will be described. First, the method for manufacturing the cooling mechanism 1 used in the present embodiment is as described above with reference to FIGS. 22 to 28 of <6. Example of Method for Manufacturing Cooling Mechanism According to Third Embodiment>. However, in order to increase the mass production effect, as described above in <9. Example of Method for Manufacturing Semiconductor Device Equipped With Cooling Mechanism According to First Embodiment>, silicon or the first to third glass substrates 14 may be used instead of the copper plates 2 and 3 to form the copper layers 12 and 13. Note that, in a case where the glass substrate 14 is used, all the substrates are removed at the time of dicing as described above.

Since the points other than the above are similar to the method for manufacturing the semiconductor device 10 on which the cooling mechanism 1 according to the first embodiment is mounted, the description thereof will be omitted.

12. Example of Method for Manufacturing Semiconductor Device Using Cooling Mechanism According to Fourth Embodiment Next, a method for manufacturing the semiconductor device 10 using the cooling mechanism 1 according to the fourth embodiment will be described. First, the method for manufacturing the cooling mechanism 1 used in the present embodiment is as described above in <8. Example of Method for Manufacturing Cooling Mechanism According to Fourth Embodiment>. However, in order to increase the mass production effect, as described above in <9. Example of Method for Manufacturing Semiconductor Device Equipped With Cooling Mechanism According to First Embodiment>, silicon or the first to third glass substrates 14 may be used instead of the copper plates 2 and 3 to form the copper layers 12 and 13. Note that, in a case where the glass substrate 14 is used, all the substrates are removed at the time of dicing as described above.

Next, a method for manufacturing the semiconductor device 10 using the cooling mechanism 1 will be described. The semiconductor device 10 according to the present embodiment is suitable for a solid-state imaging device of an FBGA package adopting wire bonding connection.

Figure 38A:
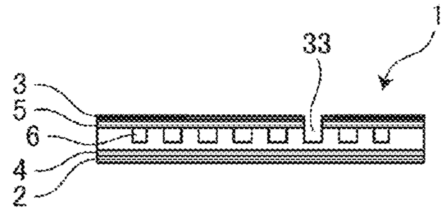
FIGS. 38A and 38B are cross-sectional views (part 1) illustrating the method for manufacturing the semiconductor device using the cooling mechanism according to the fourth embodiment.
Figure 38B:
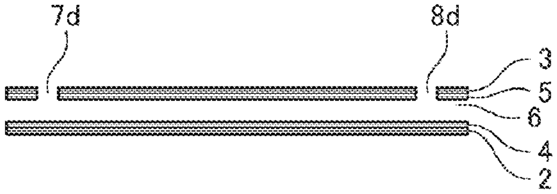

First, as illustrated in an X cross-sectional view of FIG. 38A and a Y cross-sectional view of FIG. 38B, the cooling mechanism 1 manufactured by the example of the method for manufacturing the cooling mechanism according to the above-described fourth embodiment is prepared.

Next, as illustrated in both the drawings, the protective film 9 is formed on the copper plate 3 on the cooling mechanism 1, and the wiring layer 42 is disposed thereon.

Figure 39C:
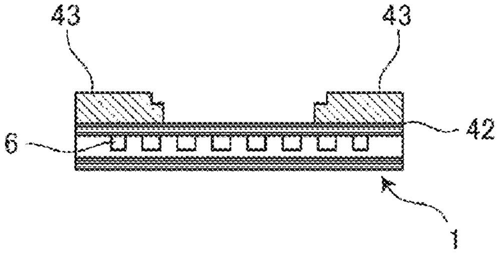
FIGS. 39C and 39D are cross-sectional views (part 2) illustrating the method for manufacturing the semiconductor device using the cooling mechanism according to the fourth embodiment.
Figure 39D:
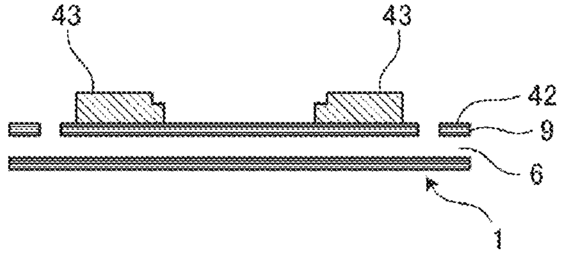

Next, as illustrated in an X cross-sectional view of FIG. 39C and a Y cross-sectional view of FIG. 39D, the semiconductor chip 11 is bonded to a substantially central portion of the wiring layer 42. In addition, the BGA formed on the lower surface of the semiconductor chip 11 is electrically connected to a predetermined pad of the wiring layer 42. Then, a predetermined pad of the rewiring layer 43 disposed on the peripheral surface of the semiconductor chip 11 and a predetermined pad of the semiconductor chip 11 are wire-bonded by, for example, the gold wire 11*a*. As a result, a circuit is formed.

Figure 40E:
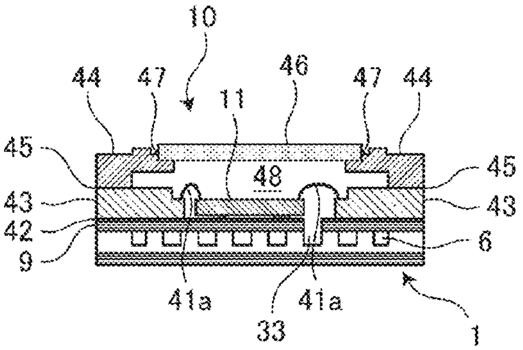
FIGS. 40E and 40F are cross-sectional views (part 3) illustrating the method for manufacturing the semiconductor device using the cooling mechanism according to the fourth embodiment.
Figure 40F:
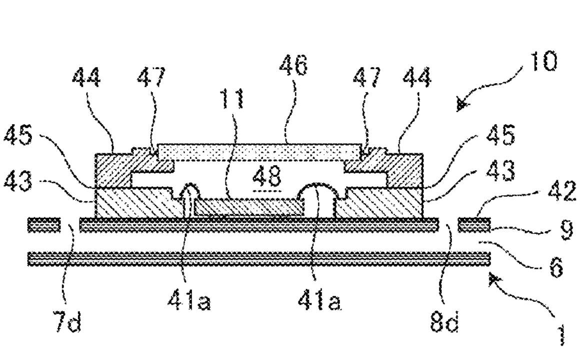

On the upper surface of the rewiring layer 43, as illustrated in the X cross-sectional view of FIG. 40E and the Y-sectional view of FIG. 40F, the frame 44 is bonded by the frame mount sealing resin 45. Then, the cover glass 46 is placed on the upper surface of the frame mount sealing resin 45, and is bonded to the frame 44 by the sealing glass resin 47.

By having the above steps, the semiconductor device 10 using the cooling mechanism 1 according to the fourth embodiment can be manufactured. In the semiconductor device 10 using the cooling mechanism 1 manufactured according to the present embodiment, as illustrated in the plan view of FIG. 30B, the rewiring layer 43 surrounds the semiconductor chip 11. Then, the cover glass 46 is placed on a rectangular space surface further surrounded by the frame 44 bonded thereon, and is bonded to the frame 44 to cover the upper surface of the semiconductor chip 11. As a result, the space in which the semiconductor chip 11 is disposed forms the hollow cavity 48 which is an airtight space.

However, in the semiconductor device 10 using the cooling mechanism 1 according to the fourth embodiment, as illustrated in FIG. 40E, the air vent hole 33 is provided in the copper plate 3 on which the graphene layer 5 is formed. Therefore, as described above, the air vent hole 33 can be a breathing hole between the hollow cavity 48 and the external space via the nanocapillary channel 6. As a result, it is possible to solve the conventional problem as described above.

That is, (1) since breathing is possible between the hollow cavity 48 and the external space, air and moisture inside the hollow cavity 48 can be directly discharged to the outside, and peeling, warpage, and the like due to condensation prevention and internal pressure expansion are suppressed.

(2) Since the nanocapillary channel 6 has an extremely fine opening diameter, there is no concern about dust having a size that causes a defect in a solid-state imaging device.

(3) Since it is not necessary to consider moisture permeability, the degree of freedom in selecting characteristics, sizes, shapes, and the like of the frame mount sealing resin 45, the sealing glass resin 47, and the like increases.

Specifically, conventionally, there have been various restrictions on the selection of the sealing resin, but since it is not necessary to consider moisture permeability, these restrictions are removed. In addition, when the cover glass 46 is sealed, it has been necessary to tune temperature, humidity, atmospheric pressure, and the like, but such restrictions on quality control can also be relaxed. Furthermore, the frame 44 can be downsized, and the above-described innovative effect is obtained.

13. Another Embodiment of Semiconductor Device Using Cooling Mechanism According to Present Disclosure Next, another embodiment of the semiconductor device 10 using the cooling mechanism 1 according to the present disclosure will be described. In the present embodiment, in addition to mounting the semiconductor device 10 on the cooling mechanism 1 according to the present disclosure, for example, the nanocapillary channel 6*a* is further inserted between the rewiring layer 43 and the frame 44 of the semiconductor device 10, or the nanocapillary channel 6*a* is embedded in the frame 44.

Figure 41:
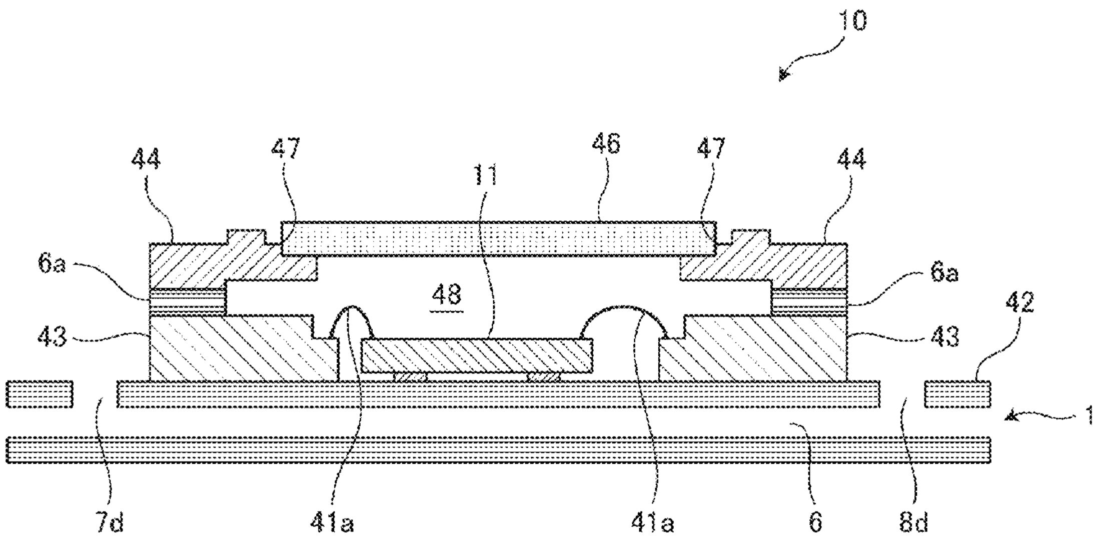
FIG. 41 is a cross-sectional view illustrating another embodiment of the semiconductor device using the cooling mechanism according to the present disclosure.

Specifically, as illustrated in the Y cross-sectional view of FIG. 41, the nanocapillary channel 6*a* is inserted between the rewiring layer 43 and the frame 44 without providing the air vent hole 33 in the configuration of FIG. 30A described above. With such a configuration, air is blown from the inlet 7 to the nanocapillary channel 6 disposed below the semiconductor chip 11 by the blower 28 or water is supplied by the pump 23, and heat generated by the semiconductor chip 11 is discharged from the outlet 8 to the outside.

In addition, as illustrated in FIG. 41, by inserting the nanocapillary channel 6*a* between the rewiring layer 43 and the frame 44, or by embedding the nanocapillary channel 6*a* in the frame 44, when the temperature in the hollow cavity 48 rises due to heat generation of the semiconductor chip 11, a temperature rise in a reflow furnace, or the like, and the internal pressure rises, air is released to the external space via the nanocapillary channel 6*a*, and the internal pressure is suppressed.

In addition, the nanocapillary channel 6*a* may be inserted between the rewiring layer 43 and the frame 44 in a state where the air vent hole 33 in the configuration of FIG. 30A described above is provided.

In this case, air is blown from the inlet 7 to the nanocapillary channel 6 disposed below the semiconductor chip 11 by the blower 28, and the heat generated by the semiconductor chip 11 is discharged from the outlet 8 to the outside. In addition, a part of the air passing through the nanocapillary channel 6 is injected into the hollow cavity 48 through the air vent hole 33, and the high-temperature air in the hollow cavity 48 is discharged from the nanocapillary channel 6*a* to the external space, so that the effect of suppressing the temperature rise of the semiconductor chip 11 is obtained.

Note that, in this case, it is not preferable to use water as the refrigerant 21 because the inside of the hollow cavity 48 is immersed in water.

In addition, in the case of natural cooling, when the temperature in the hollow cavity 48 rises, the warmed air rises and is discharged to the external space via the nanocapillary channel 6*a*, and instead, low-temperature air enters the hollow cavity 48 from the air vent hole 33. Therefore, an air flow is formed, and an effect of suppressing a temperature rise of the semiconductor chip 11 is obtained.

With the above configuration, it is possible to simultaneously suppress both the temperature rise of the semiconductor device 10 and the internal pressure rise in the hollow cavity 48. The temperature rise of the semiconductor device 10 and the suppression of the internal pressure rise in the hollow cavity 48 are long-standing concerns in the semiconductor device 10 having the hollow cavity 48 such as a solid-state imaging device. According to the technology of the present disclosure, it is possible to solve each of these problems, and thus, an extremely remarkable effect is obtained.

Note that the cooling mechanism 1 used in the present embodiment may be any one of the first to fourth embodiments described above.

14. Configuration Example of Electronic Device

As an example of the semiconductor device 10 including the cooling mechanism 1 having the nanocapillary structure according to the above-described embodiments, an example in which a solid-state imaging device 201 including the cooling mechanism 1 is applied to an electronic device will be described with reference to FIG. 42. Note that this application example is common to the cooling mechanism 1 according to the first to fourth embodiments, the semiconductor device 10 including the cooling mechanism 1, and the semiconductor device 10 using the cooling mechanism 1 according to the present disclosure.

The solid-state imaging device 201 is applicable to all electronic devices using an image capturing unit (photoelectric conversion unit), such as an imaging device such as a digital still camera or a video camera, a mobile terminal device having an imaging function, and a copying machine using a solid-state imaging element for an image reading unit. The solid-state imaging device 201 may be formed as one chip, or may be in the form of a module having an imaging function in which an imaging unit and a signal processing unit or an optical system are packaged together.

Figure 42:
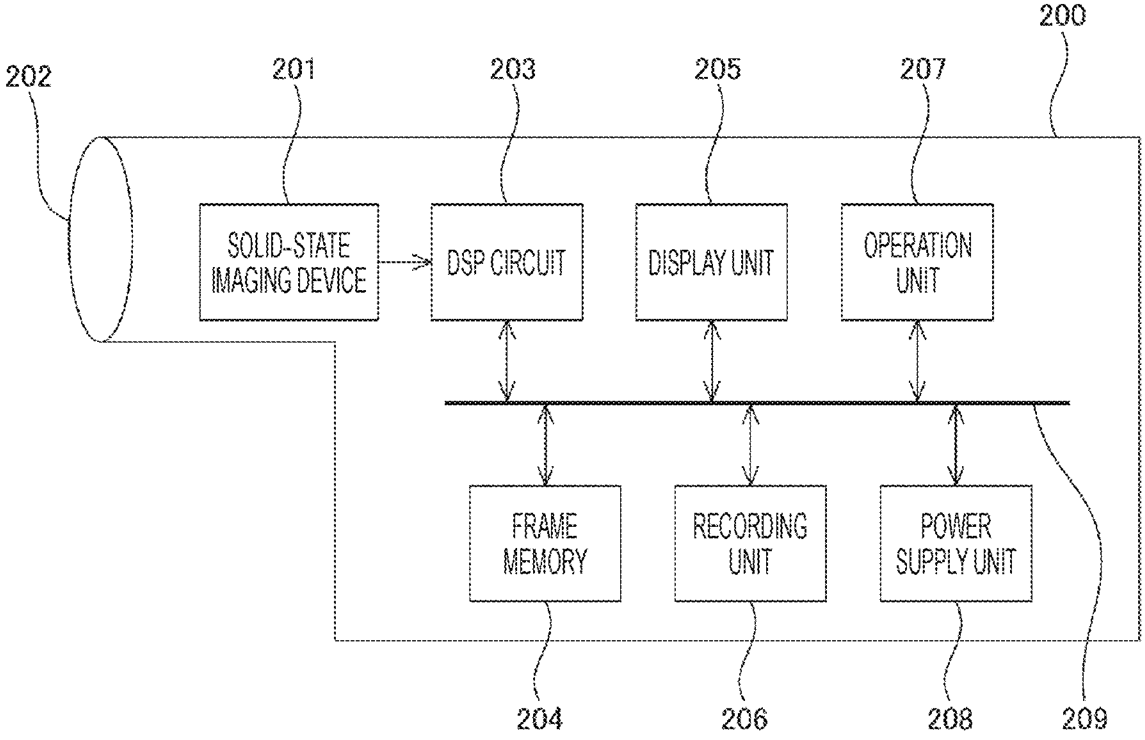
FIG. 42 is a block diagram illustrating a configuration example of an electronic device including the semiconductor device using the cooling mechanism according to the present disclosure. disclosure.

As illustrated in FIG. 42, an imaging device 200 as an electronic device includes an optical unit 202, a solid-state imaging device 1, a digital signal processor (DSP) circuit 203 which is a camera signal processing circuit, a frame memory 204, a display unit 205, a recording unit 206, an operation unit 207, and a power supply unit 208. The DSP circuit 203, the frame memory 204, the display unit 205, the recording unit 206, the operation unit 207, and the power supply unit 208 are connected to each other via a bus line 209 including a signal line and a power supply line.

The optical unit 202 includes a plurality of lenses, and captures incident light (image light) from a subject to form an image on an imaging surface of the solid-state imaging device 201. The solid-state imaging device 201 converts the light amount of the incident light imaged on the imaging surface by the optical unit 202 into an electrical signal in units of pixels and outputs the electrical signal as a pixel signal.

The display unit 205 includes, for example, a panel type display device such as a liquid crystal panel or an organic electro luminescence (EL) panel, and displays a moving image or a still image captured by the solid-state imaging device 1. The recording unit 206 records the moving image or the still image captured by the solid-state imaging device 201 on a recording medium such as a hard disk or a semiconductor memory.

The operation unit 207 issues operation commands for various functions of the imaging device 200 under operation by the user. The power supply unit 208 appropriately supplies various power sources serving as operation power sources of the DSP circuit 203, the frame memory 204, the display unit 205, the recording unit 206, and the operation unit 207 to these supply targets.

According to the imaging device 200 as described above, in the solid-state imaging device 201, since breathing is possible between the hollow cavity 48 and the external space, it is possible to directly release the air and moisture inside the hollow cavity 48 to the outside, and it is possible to suppress a temperature rise, prevent dew condensation, suppress peeling, warpage, and the like due to internal pressure expansion to improve quality. In addition, since restrictions on manufacturing and quality control are also reduced, manufacturing cost can be reduced, and an inexpensive electronic device can be provided.

The description of the above-described embodiments is an example of the present technology, and the present technology is not limited to the above-described embodiments. For this reason, it is needless to say that various modifications other than the above-described embodiments can be made according to the design and the like without departing from the technical idea according to the present disclosure.

In addition, the effects described in the present specification are merely examples and are not limited, and other effects may be provided. In addition, the configurations of the above-described embodiments can be combined in any manner. Therefore, the configuration examples described in the present specification are merely examples, and are not limited to the configuration example of the present description.

Note that the present technology can have the following configurations.

(1)

A cooling mechanism including:

a first metal layer;

a first graphene layer formed on the first metal layer and having a nanocapillary channel;

a second graphene layer joined to an upper surface of the nanocapillary channel to form an opening of a passage for a refrigerant; and a second metal layer covering the second graphene layer.

(2)

A cooling mechanism including:

a first metal layer;

a first graphene layer formed on the first metal layer and having a nanocapillary channel;

a second graphene layer bonded to an upper surface of the nanocapillary channel; and a second metal layer covering the second graphene layer having an opening penetrating both ends of the second graphene layer in a vertical direction and communicating with the nanocapillary channel.

(3)

The cooling mechanism according to (1) or (2), in which a plurality of the first graphene layer and the second graphene layer having the nanocapillary channel is laminated between the first metal layer and the second metal layer.

(4)

The cooling mechanism according to any one of (1) to (3), in which the second graphene layer and the second metal layer have an air vent hole penetrating therethrough.

(5)

The cooling mechanism according to any one of (1) to (4), in which the opening has an inlet through which the refrigerant is sucked on one side and an outlet through which the refrigerant is discharged on another side, the inlet and the outlet protruding in a horizontal direction or erected upward.

(6)

A semiconductor device including a cooling mechanism including:

a first metal layer;

a first graphene layer formed on the first metal layer and having a nanocapillary channel;

a second graphene layer joined to an upper surface of the nanocapillary channel to form an opening of a passage for a refrigerant; and a second metal layer covering the second graphene layer.

(7)

A semiconductor device including a cooling mechanism including:

a first metal layer;

a first graphene layer formed on the first metal layer and having a nanocapillary channel;

a second graphene layer bonded to an upper surface of the nanocapillary channel; and a second metal layer covering the second graphene layer having an opening penetrating both ends of the second graphene layer in a vertical direction and communicating with the nanocapillary channel.

(8)

A semiconductor device including a cooling mechanism including:

a first metal layer;

a first graphene layer formed on the first metal layer and having a nanocapillary channel;

a second graphene layer joined to an upper surface of the nanocapillary channel to form an opening of a passage for a refrigerant; and a second metal layer covering the second graphene layer, in which a plurality of the first graphene layer and the second graphene layer having the nanocapillary channel is laminated between the first metal layer and the second metal layer.

(9)

A semiconductor device including a cooling mechanism including:

a first metal layer;

a first graphene layer formed on the first metal layer and having a nanocapillary channel;

a second graphene layer bonded to an upper surface of the nanocapillary channel; and a second metal layer covering the second graphene layer having an opening penetrating both ends of the second graphene layer in a vertical direction and communicating with the nanocapillary channel, in which a plurality of the first graphene layer and the second graphene layer having the nanocapillary channel is laminated between the first metal layer and the second metal layer.

(10)

The semiconductor device according to any one of (6) to (9), in which the opening of the cooling mechanism has an inlet through which the refrigerant is sucked on one side and an outlet through which the refrigerant is discharged on another side, the inlet and the outlet protruding in a horizontal direction or erected upward.

(11)

A semiconductor device including:

a cooling mechanism including:

a first metal layer;

a first graphene layer formed on the first metal layer and having a nanocapillary channel;

a second graphene layer joined to an upper surface of the nanocapillary channel to form an opening of a passage for a refrigerant; and a second metal layer covering the second graphene layer; and a semiconductor chip surrounded by a partition wall and disposed in a hollow cavity formed by covering an upper surface of the cooling mechanism with a cover glass on the upper surface of the cooling mechanism.

(12)

The semiconductor device according to (11), in which the partition wall is configured to be air-permeable to an external space by the nanocapillary channel.

(13)

The semiconductor device according to (11) or (12), in which the second graphene layer and the second metal layer covering the second graphene layer have an air vent hole penetrating therethrough.

(14)

A method for manufacturing a cooling mechanism, the method including:

forming a first graphene layer on a first copper plate;

forming a nanocapillary channel in the first graphene layer;

forming a second graphene layer on a second copper plate; and bonding a surface of the second graphene layer formed on the second copper plate to the nanocapillary channel formed in the first graphene layer.

(15)

A method for manufacturing a semiconductor device including a cooling mechanism, the method including:

forming a first insulating layer on a first silicon or glass substrate;

forming a first copper layer on the first insulating layer;

forming a first graphene layer on the first copper layer to form a nanocapillary channel;

forming an insulating layer on a second silicon or glass substrate;

forming a second copper layer on the insulating layer;

forming a second graphene layer on the second copper layer;

bonding the nanocapillary channel formed on the first silicon or glass substrate and the second graphene layer formed on the second silicon or glass substrate;

removing the first silicon or glass substrate;

forming a first adhesive layer on a third glass substrate;

rearranging a plurality of known good die semiconductor chips on the first adhesive layer;

filling the known good die semiconductor chips rearranged on the third glass substrate with a mold, flattening a surface of the semiconductor chips, and forming a second adhesive layer on the surface of the semiconductor chips;

bonding a surface from which the first silicon or glass substrate has been removed to the second adhesive layer, and mounting the nanocapillary channel on the semiconductor chips filled with the mold;

debonding and removing the third glass substrate;

removing the second silicon or glass substrate; and dicing the semiconductor chips filled with the mold and the nanocapillary channel mounted on the semiconductor chips.

(16)

An electronic device including a semiconductor device using a cooling mechanism including:

a first metal layer;

a first graphene layer formed on the first metal layer and having a nanocapillary channel;

a second graphene layer joined to an upper surface of the nanocapillary channel to form an opening of a passage for a refrigerant; and a second metal layer covering the second graphene layer.

REFERENCE SIGNS LIST

1 Cooling mechanism
2, 3 Copper plate
4, 5 Graphene layer
4S, 5S Graphene sheet
6, 6*a* Nanocapillary channel
7 Inlet
7*a*, 8*a* Joint
7*b*, 8*b* Lid
7*c*, 8*c* Opening
7*d*, 8*d* Vent hole
8 Outlet
9 Protective film
10 Semiconductor device
11 Semiconductor chip
11*a* Gold wire
12, 13 Copper layer
14 Glass substrate
15 Insulating layer
16 Adhesive layer
17 Molding resin
19 Cut line
20 Cooling device
21 Refrigerant
22 Refrigerant tank
23 Pump
24 Feed pipe
27 Return pipe
28 Blower
33 Air vent hole
42 Wiring layer
43 Rewiring layer
44 Frame
45 Frame mount sealing resin
46 Cover glass
47 Sealing glass resin
48 Hollow cavity
50 PKG substrate
200 Imaging device (electronic device)
201 Solid-state imaging device

What is claimed is:

1. A cooling mechanism, comprising:

a first metal layer;

a first graphene layer formed on the first metal layer, wherein a first surface of the first graphene layer is in contact with the first metal layer, and wherein a plurality of nanocapillary channels are formed in a second surface of the first graphene layer, and wherein the first surface of the first graphene layer is opposite the second surface of the first graphene layer;

a second graphene layer, wherein a first surface of the second graphene layer is joined to the second surface of the first graphene layer, wherein each nanocapillary channel in the plurality of nanocapillary channels is disposed between the first surface of the first graphene layer and a second surface of the second graphene layer, and wherein each nanocapillary channel in the plurality of nanocapillary channels includes an inlet at a first end that is in communication with an outlet at a second end to form a passage; and a second metal layer covering the second surface of the second graphene layer.

2. The cooling mechanism according to claim 1, wherein a plurality of the first graphene layers and the second graphene layers having the nanocapillary channels are laminated between the first metal layer and the second metal layer.

3. The cooling mechanism according to claim 1, wherein the second graphene layer and the second metal layer have an air vent hole penetrating therethrough.

4. The cooling mechanism according to claim 1, wherein a refrigerant is sucked into the inlet on one side of each of the nanocapillary channels and is discharged from the outlet on another side, the inlet and the outlet of each of the nanocapillary channels protruding in a horizontal direction or erected upward.

5. A cooling mechanism, comprising:

a first metal layer;

a first graphene layer formed on the first metal layer and having a nanocapillary channel;

a second graphene layer bonded to an upper surface of the nanocapillary channel; and a second metal layer covering the second graphene layer having an opening penetrating both ends of the second graphene layer in a vertical direction and communicating with the nanocapillary channel.

6. A semiconductor device, comprising a cooling mechanism comprising:

a first metal layer;

a first graphene layer formed on the first metal layer, wherein a first surface of the first graphene layer is in contact with the first metal layer, and wherein a plurality of nanocapillary channels are formed in a second surface of the first graphene layer, and wherein the first surface of the first graphene layer is opposite the second surface of the first graphene layer;

a second graphene layer, wherein a first surface of the second graphene layer is joined to the second surface of the first graphene layer, wherein each nanocapillary channel in the plurality of nanocapillary channels is disposed between the first surface of the first graphene layer and a second surface of the second graphene layer, and wherein each nanocapillary channel in the plurality of nanocapillary channels includes an inlet at a first end that is in communication with an outlet at a second end to form a passage for a refrigerant; and a second metal layer covering the second surface of the second graphene layer.

7. The semiconductor device according to claim 6, wherein a refrigerant is sucked on one side of each of the nanocapillary channels and is discharged from the outlet on another side, the inlet and the outlet of each of the nanocapillary channels protruding in a horizontal direction or erected upward.

8. A semiconductor device, comprising a cooling mechanism comprising:

a first metal layer;

a first graphene layer formed on the first metal layer and having a nanocapillary channel;

a second graphene layer bonded to an upper surface of the nanocapillary channel; and a second metal layer covering the second graphene layer having an opening penetrating both ends of the second graphene layer in a vertical direction and communicating with the nanocapillary channel.

9. A semiconductor device, comprising a cooling mechanism comprising:

a first metal layer;

a plurality of first graphene layers, wherein a first one of the graphene layers is formed on the first metal layer, wherein a first surface of the first one of the first graphene layers is in contact with the first metal layer, and wherein each of the first graphene layers includes a plurality of nanocapillary channels formed in a second surface of each of the first graphene layers, and wherein the first surface of each of the first graphene layers is opposite the second surface;

a plurality second graphene layers, wherein a first surface of each of the second graphene layers is joined to the second surface of a corresponding one of the plurality of first graphene layers, wherein each nanocapillary channel in the plurality of nanocapillary channels is disposed between the first surface of one of the first graphene layers and a second surface of one of the second graphene layers, and wherein each nanocapillary channel in the plurality of nanocapillary channels includes an inlet at a first end that is in communication with an outlet at a second end to form a passage for a refrigerant; and a second metal layer covering the second surface of a first one of the second graphene, wherein a the plurality of the first graphene layers and the plurality of the second graphene layers having the plurality of nanocapillary channels are laminated between the first metal layer and the second metal layer.

10. A semiconductor device, comprising a cooling mechanism comprising:

a first metal layer;

a first graphene layer formed on the first metal layer and having a nanocapillary channel;

a second graphene layer bonded to an upper surface of the nanocapillary channel; and a second metal layer covering the second graphene layer having an opening penetrating both ends of the second graphene layer in a vertical direction and communicating with the nanocapillary channel, wherein a plurality of the first graphene layer and the second graphene layer having the nanocapillary channel is laminated between the first metal layer and the second metal layer.

11. A semiconductor device, comprising:

a cooling mechanism comprising:

a first metal layer;

a first graphene layer formed on the first metal layer and having a nanocapillary channel;

a second graphene layer joined to an upper surface of the nanocapillary channel to form an opening of a passage for a refrigerant; and a second metal layer covering the second graphene layer; and a semiconductor chip surrounded by a partition wall and disposed in a hollow cavity formed by covering an upper surface of the cooling mechanism with a cover glass on the upper surface of the cooling mechanism.

12. The semiconductor device according to claim 11, wherein the partition wall is configured to be air-permeable to an external space by the nanocapillary channel.

13. The semiconductor device according to claim 11, wherein the second graphene layer and the second metal layer covering the second graphene layer have an air vent hole penetrating therethrough.

14. An electronic device, comprising a semiconductor device including a cooling mechanism comprising:

a first metal layer;

a first graphene layer formed on the first metal layer, wherein a first surface of the first graphene layer is in contact with the first metal layer, and wherein a plurality of nanocapillary channels are formed in a second surface of the first graphene layer, and wherein the first surface of the first graphene layer is opposite the second surface of the first graphene layer;

a second graphene layer, wherein a first surface of the second graphene layer is joined to the second surface of the first graphene layer, wherein each nanocapillary channel in the plurality of nanocapillary channels is disposed between the first surface of the first graphene layer and a second surface of the second graphene layer, and wherein each nanocapillary channel in the plurality of nanocapillary channels includes an inlet at a first end that is in communication with an outlet at a second end to form a passage for a refrigerant; and a second metal layer covering the second surface of the second graphene layer.

* * * * *